US011508429B2

(12) United States Patent
Choi et al.

(10) Patent No.: US 11,508,429 B2
(45) Date of Patent: Nov. 22, 2022

(54) MEMORY SYSTEM PERFORMING HAMMER REFRESH OPERATION AND METHOD OF CONTROLLING REFRESH OF MEMORY DEVICE

(71) Applicant: SAMSUNG ELECTRONICS CO., LTD., Suwon-si (KR)

(72) Inventors: Yeonkyu Choi, Seoul (KR); Dokyun Kim, Seongnam-si (KR); Seongjin Lee, Hwaseong-si (KR); Doohee Hwang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/399,402

(22) Filed: Aug. 11, 2021

(65) Prior Publication Data

US 2022/0157373 A1 May 19, 2022

(30) Foreign Application Priority Data

Nov. 19, 2020 (KR) .......................... 10-2020-0155414

(51) Int. Cl.
*G11C 11/406* (2006.01)
*G11C 7/10* (2006.01)

(52) U.S. Cl.
CPC ...... *G11C 11/40615* (2013.01); *G11C 7/1063* (2013.01); *G11C 11/40622* (2013.01); *G11C 11/40626* (2013.01)

(58) Field of Classification Search
CPC ........ G11C 11/40615; G11C 11/40622; G11C 11/40626; G11C 7/1063

USPC ......................................................... 365/222
See application file for complete search history.

(56) References Cited

U.S. PATENT DOCUMENTS

| 9,236,110 | B2 | 1/2016 | Bains et al. |
| 9,484,079 | B2 | 11/2016 | Lee |
| 9,741,421 | B1 | 8/2017 | Hedden |
| 9,761,298 | B2 | 9/2017 | Halbert et al. |
| 9,972,377 | B2* | 5/2018 | Oh .......................... G11C 11/406 |
| 10,127,974 | B2 | 11/2018 | Kim et al. |
| 10,504,577 | B1 | 12/2019 | Alzheimer |
| 10,529,406 | B2 | 1/2020 | Choi et al. |
| 10,607,683 | B2* | 3/2020 | Shin ................... G11C 11/40618 |
| 10,770,127 | B2* | 9/2020 | Shore ..................... G11C 11/406 |
| 10,790,005 | B1* | 9/2020 | He ............................ G11C 7/24 |

(Continued)

*Primary Examiner* — Son L Mai
(74) *Attorney, Agent, or Firm* — Lee IP Law, P.C.

(57) ABSTRACT

A memory system includes a memory controller and a memory device. The memory controller generates refresh commands periodically by an average refresh interval. The memory device performs a normal refresh operation and a hammer refresh operation during a refresh cycle time. The memory device includes a memory cell array including memory cells connected to a plurality of wordlines, a temperature sensor configured to provide temperature information by measuring an operation temperature of the memory cell array and a refresh controller configured to control the normal refresh operation and the hammer refresh operation. The refresh controller varies a hammer ratio of a unit hammer execution number of the hammer refresh operation executed during the refresh cycle time with respect to a unit normal execution number of the normal refresh operation executed during the refresh cycle time.

20 Claims, 23 Drawing Sheets

(56) References Cited

U.S. PATENT DOCUMENTS

| | | | |
|---|---|---|---|
| 10,811,077 B2* | 10/2020 | Shin | ................ G11C 11/40622 |
| 2020/0219556 A1 | 7/2020 | Ishikawa et al. | |

\* cited by examiner

FIG. 2

| Refresh Conditions | | Symbol | 2Gb | 3Gb | 4Gb | 6Gb | 8Gb | Units |
|---|---|---|---|---|---|---|---|---|
| Density per Channel | | | 2Gb | 3Gb | 4Gb | 6Gb | 8Gb | |
| Number of banks per channel | | | 8 | 8 | | | 8 | |
| Refresh Window(tREFW) (TCASE ≤ 85°C) | | tREFW | 32 | 32 | | | 32 | ms |
| Required Number of REFRESH Commands in a tREFW window | | R | 8192 | 8192 | | | 8192 | - |
| Average Refresh Interval | REFAB | tREFI | 3,904 | 3,904 | | | 3,904 | us |
| | REFPB | trefIpb | 488 | 488 | | | 488 | ns |
| Refresh Cycle Time(All Banks) | | tRFCab | 130 | 180 | 180 | | 280 | ns |
| Refresh Cycle Time(Per Bank) | | tRFCpb | 60 | 90 | 90 | | 140 | ns |

FIG. 3

| TEMPERATURE LEVEL | TCODE | To |
|---|---|---|
| TLH | 110 | 65°C < To < 85°C |
| TLM | 101 | 45°C < To < 65°C |
| TLL | 100 | To < 45°C |

FIG. 4

| MRSET | OP7 | OP6 | OP5 | OP4 | OP3 | OP2 | OP1 | OP0 |
|---|---|---|---|---|---|---|---|---|
| | MD | HMRT | | | F | MAC | | |

HCINF (spans OP7–OP4)

MEMORY SYSTEM PERFORMING HAMMER REFRESH OPERATION AND METHOD OF CONTROLLING REFRESH OF MEMORY DEVICE

CROSS-REFERENCE TO RELATED APPLICATION

Korean Patent Application No. 10-2020-0155414, filed on Nov. 19, 2020 in the Korean Intellectual Property Office, and entitled: "Memory System Performing Hammer Refresh Operation and Method of Controlling Refresh of Memory Device," is incorporated by reference herein in its entirety.

BACKGROUND

1. Field

Example embodiments relate generally to semiconductor integrated circuits, and more particularly to a memory system performing a hammer refresh operation and a method of controlling refresh of a memory device.

2. Description of the Related Art

Semiconductor memory devices for storing data may be classified into volatile memory devices and non-volatile memory devices. Volatile memory devices, such as dynamic random access memory (DRAM) devices, store data by charging or discharging capacitors in memory cells, and lose the stored data when power is off. Non-volatile memory devices, such as flash memory devices, maintain stored data even when power is off. Volatile memory devices are widely used as main memories of various apparatuses, and non-volatile memory devices are widely used for storing program code and/or data in various electronic devices, e.g., computers, mobile devices, etc.

In volatile memory devices, cell charges stored in a memory cell may be lost due to a leakage current. In addition, when a wordline is transitioned frequently between an active state and a precharged state (e.g., when the wordline has been accessed intensively or frequently), a memory cell connected to a wordline that is adjacent to the frequently accessed wordline may be affected and lose stored charges, potentially causing data loss. Charges stored in a memory cell may be maintained by recharging before data is lost due to leakage of the charges. Such recharge of cell charges is referred to as a refresh operation, and a refresh operation may be performed repeatedly before cell charges are significantly lost.

SUMMARY

Embodiments are directed to a memory system, including: a memory controller configured to generate refresh commands periodically by an average refresh interval; and a memory device configured to perform a normal refresh operation and a hammer refresh operation during a refresh cycle time from a time point when each refresh command is received, generation of other commands being inhibited during the refresh cycle time, the normal refresh operation being performed by sequentially selecting one-by-one a plurality of wordlines during a refresh period, the hammer refresh operation being performed by selecting a victim wordline physically adjacent to a hammer wordline that is accessed more frequently than other wordlines. The memory device may include: a memory cell array including memory cells connected to the plurality of wordlines; a temperature sensor configured to provide temperature information by measuring an operation temperature of the memory cell array; and a refresh controller configured to control the normal refresh operation and the hammer refresh operation, and configured to vary a hammer ratio of a unit hammer execution number of the hammer refresh operation executed during the refresh cycle time with respect to a unit normal execution number of the normal refresh operation executed during the refresh cycle time.

Embodiments are also directed to a method of controlling refresh of a memory device, including: providing temperature information by measuring an operation temperature of a memory cell array included in a memory device; receiving refresh commands periodically by an average refresh interval from a memory controller; performing a normal refresh operation by sequentially selecting one-by-one a plurality of wordlines during a refresh period; performing a hammer refresh operation by selecting a victim wordline physically adjacent to a hammer wordline that is accessed more frequently than other wordlines; and, based on the temperature information, varying a hammer ratio of a unit hammer execution number of the hammer refresh operation executed during a refresh cycle time with respect to a unit normal execution number of the normal refresh operation executed during the refresh cycle time.

Embodiments are also directed to a memory device, including: a memory cell array including memory cells connected to a plurality of wordlines; a temperature sensor configured to provide temperature information by measuring an operation temperature of the memory cell array; and a refresh controller configured to control a normal refresh operation and a hammer refresh operation, the normal refresh operation being performed by sequentially selecting one-by-one the plurality of wordlines during a refresh period, the hammer refresh operation being performed by selecting a victim wordline physically adjacent to a hammer wordline that is accessed more frequently than other wordlines, and the refresh controller being configured to, based on the temperature information, vary a hammer ratio of a unit hammer execution number of the hammer refresh operation executed during a refresh cycle time with respect to a unit normal execution number of the normal refresh operation executed during the refresh cycle time.

BRIEF DESCRIPTION OF THE DRAWINGS

Features will become apparent to those of skill in the art by describing in detail example embodiments with reference to the attached drawings in which:

FIG. 2 is a diagram illustrating an example of refresh conditions of a memory device according to example embodiments.

FIG. 3 is a diagram illustrating an example of setting temperature levels of a memory device according to example embodiments.

FIG. 4 is a diagram illustrating an example of register information of a memory device according to example embodiments.

DETAILED DESCRIPTION

Figure 1:
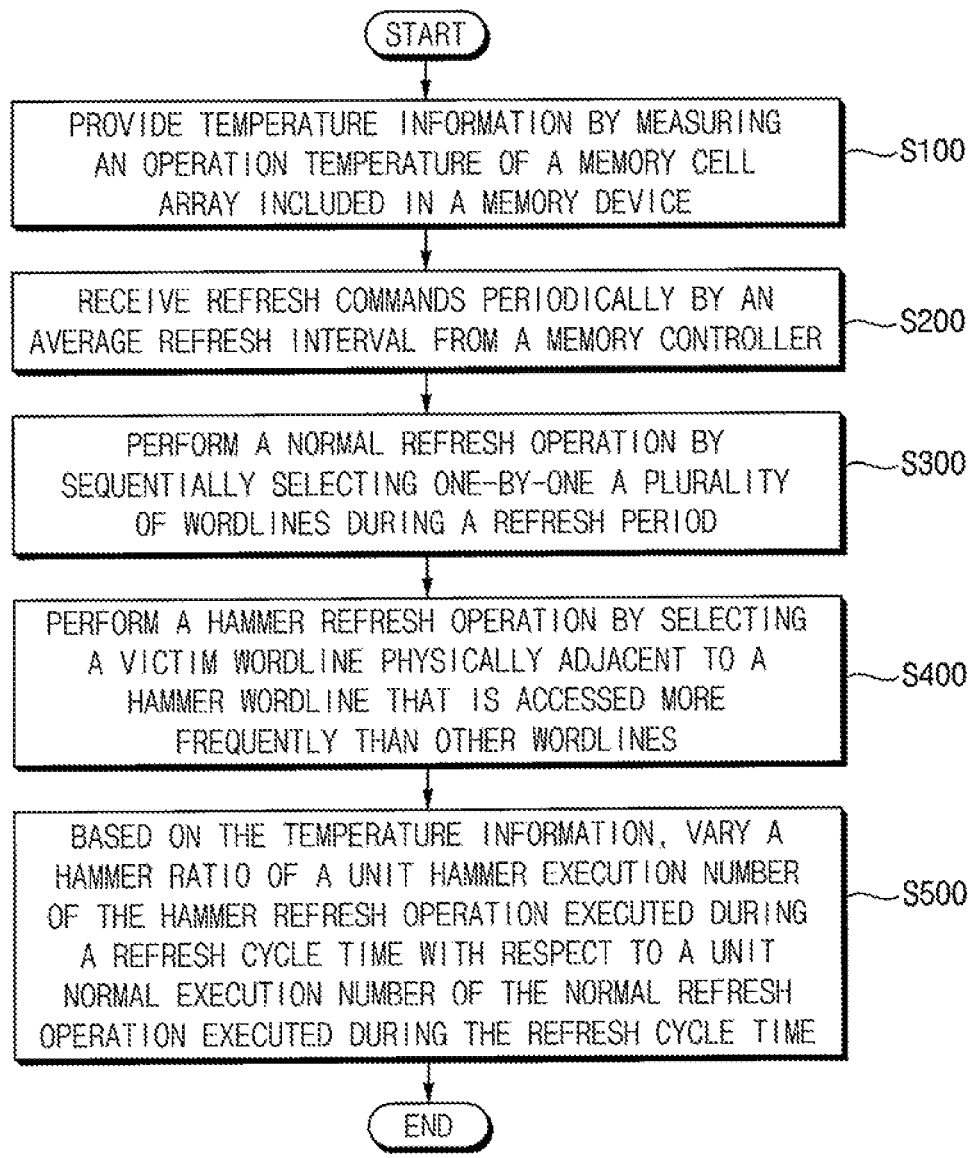
FIG. 1 is a flow chart illustrating a method of controlling refresh of a memory device according to example embodiments.

FIG. 1 is a flow chart illustrating a method of controlling refresh of a memory device according to example embodiments.

Referring to FIG. 1, temperature information may be provided by measuring an operation temperature of a memory cell array included in a memory device (S100). The operation temperature may be measured using an on-chip sensor disposed near the memory cell array or a sensor of other types.

Refresh commands may be received periodically by an average refresh interval from a memory controller (S200). The memory device may receive the refresh command according to predetermined refresh conditions, and perform the refresh operation based on timings of receiving the refresh commands. The refresh conditions such as a refresh period, an average refresh interval, a refresh cycle time, etc., will be described below with reference to FIG. 2.

In the memory device, a normal refresh operation may be performed by sequentially selecting one-by-one a plurality of wordlines during a refresh period (S300) and a hammer refresh operation may be performed by selecting a victim wordline physically adjacent to a hammer wordline that is accessed more frequently than other wordlines (S400). The normal refresh operation and the hammer refresh operation will be described below with reference to FIGS. 9 and 10.

Based on the temperature information, a hammer ratio may be varied (S500). The hammer ratio indicates a ratio of a unit hammer execution number of the hammer refresh operation executed during a refresh cycle time with respect to a unit normal execution number of the normal refresh operation executed during the refresh cycle time. The normal refresh operation and the hammer refresh operation may be performed during the refresh cycle time from a time point when each refresh command is received by the memory device, and other commands may be inhibited during the refresh cycle time.

A volatile memory device such as a dynamic random access memory (DRAM) may execute a refresh operation periodically due to charge leakage of memory cells storing data. Due to scale down of the manufacturing process of the DRAM, the storage capacitance of the memory cell may be decreased and thus the refresh period may be shortened. When memory capacity of the DRAM is increased, the refresh period may be further shortened because the entire refresh time is increased.

To compensate for degradation of adjacent memory cells due to the intensive access of a particular row or a hammer address, a target row refresh (TRR) scheme may be adopted and an in-memory refresh scheme may be used to reduce the burden of the memory controller. In the present example embodiment, the memory controller is totally responsible for the hammer refresh operation in the TRR scheme and the memory device is totally responsible for the hammer refresh operation in the in-memory refresh scheme. The hammer refresh operation may help to prevent data loss against the hammer event or the hammer attack as the memory device is developed to have larger memory capacity and lower power consumption.

The memory system and the method of controlling refresh of the memory device according to example embodiments may efficiently prevent data loss due to hammer attack and enhance operation reliability of the memory device and the memory system by varying the hammer ratio indicating the ratio of the unit hammer execution number with respect to the unit normal execution number based on the temperature information.

FIG. 2 is a diagram illustrating an example of refresh conditions of a memory device according to example embodiments.

FIG. 2 illustrates refresh conditions of a single-channel synchronous dynamic random access memory (SDRAM) having various densities per channel according to low power double data rate 4 (LPDDR4) standard. As an example, FIG. 2 illustrates refresh conditions for a temperature level corresponding to an operation temperature TCASE that is below or equal to 85° C.

The refresh period or the refresh window tREFW indicates a time in which each memory cell or each wordline is to be refreshed. In other words, the refresh window tREFW indicates the time for refreshing all wordlines because the refresh operation is performed by unit of wordline.

Herein, a refresh cycle time tRFC may collectively refer to a refresh cycle time for all banks (all-bank refresh tRFCab) and a refresh cycle time per bank (per-bank refresh tRFCpb). Referring to FIG. 2, the refresh conditions may be different with respect to all-bank refresh and per-bank refresh.

For example, in the case of an 8 Gb DDR4 DRAM, the refresh window tREFW is 32 ms (millisecond), the average refresh interval tREFI between two adjacent refresh commands transferred from the memory controller is about 3.904 μs (microsecond), and the refresh cycle time tRFCab is about 280 ns (nanosecond) when the number of the refresh commands during the refresh window tREFW is 8,192. Thus, the memory controller issues the refresh command by the period of 3.904 μs in average, and the memory device performs the refresh operation within 280 μs corresponding to the refresh cycle time tRFCab. In the present example embodiment, the issuance of other commands and the access to the memory device are inhibited during the refresh cycle time tRFC. Thus, the time used for the refresh cycle time tRFC affects performance of the memory system.

FIG. 3 is a diagram illustrating an embodiment of setting temperature levels of a memory device according to example embodiments. FIG. 3 illustrates an example for describing example embodiments, but setting of temperature levels is not limited to that of FIG. 3.

Referring to FIG. 3, temperature levels may be set by dividing an operation temperature To of a memory cell array (or a memory device including the memory cell array) into a plurality of temperature ranges. For example, the temperature range between 65° C.~85° C. may be set to a high temperature level TLH, the temperature range between 45° C.~65° C. may be set to a middle temperature level TLM, and the temperature range below 45° C. may be set to a low temperature level TLL. For example, it may be considered that the memory device may not operate normally in the temperature range higher than 85° C.

Because the leakage of the charge stored in the memory cell decreases as the operation temperature To decreases, the refresh window tREFW may be increased and the average refresh interval tREFI may be increased as the operation temperature To decreases. For example, the refresh window tREFW as described with reference to FIG. 2 may be 16 ms at the high temperature level TLH, 32 ms at the middle temperature level TLM, and 64 ms at the low temperature level TLL. Accordingly the average refresh interval tREFI may be 3.9 μs at the high temperature level TLH, 7.8 μs at the middle temperature level TLM, and 15.6 μs at the low temperature level TLL.

The temperature levels may be represented by values of a temperature code TCODE. For example, in FIG. 3, the value '110' of the temperature code may indicate the high temperature level TLH, the value '101' of the temperature code may indicate the middle temperature level TLM, and the value '100' of the temperature code may indicate the low temperature level TLL. The temperature sensor in the memory device may convert analog temperature information to the digital temperature code TCODE, and provide the temperature code TCODE to the memory controller and/or the refresh controller.

Hereinafter, the temperature level corresponding to relatively higher temperature range may be referred to as a first temperature level, and the temperature level corresponding to relatively lower temperature range may be referred to as a second temperature level. For example, the high temperature level THL may be the first temperature level, and the middle temperature level TLM and/or the low temperature level TLL may be the second temperature level. As another example, the middle temperature level THM may be the first temperature level and the low temperature level TLL may be the second temperature level.

FIG. 4 is a diagram illustrating an example embodiment of register information of a memory device according to example embodiments.

For example, a mode register in a mode register set MRS (412 in FIG. 9) may have a setting configuration MRSET. The operand values OP7~OP0 may include mode information MD, hammer ratio information HMRT, flag information F, and maximum active count information MAC. The mode information MD and the hammer ratio information may be collectively referred to as hammer control information HCINF.

The mode information MD may indicate whether an operation mode of the memory system is a fixed hammer control mode FHCM or a variable hammer control mode VHCM. In an example embodiment, a value '0' of the mode information MD indicates the fixed hammer control mode FHCM and a value '1' of the mode information MD indicates the variable hammer control mode VHCM. The fixed hammer control mode FHCM and the variable hammer control mode VHCM will be described below with reference to FIGS. 5 through 7.

The hammer ratio information HMRT may include a hammer ratio, which indicates a ratio of a unit hammer execution number of the hammer refresh operation executed during the refresh cycle time tRFC with respect to a unit normal execution number of the normal refresh operation executed during the refresh cycle time tRFC. The memory controller may determine the hammer ratio information HMRT based on the operation temperature To of the memory cell array and/or a degree of importance of data stored in the memory cell array. In an example embodiment, a larger value of the hammer ratio information HMRT may indicate a larger number of the hammer refresh operations to be executed during each refresh cycle time tRFC.

The flag information F may indicate validity of the maximum active count information MAC. The maximum active count information MAC may indicate the maximum number of active operations of a hammer wordline (or a hammer row) that are permitted within the refresh window tREFW before a victim wordline (or a victim row) physically adjacent to the hammer wordline is refreshed.

The memory controller may generate the hammer control information HCINF based on the temperature information or the temperature code TCODE provided from the memory device, and transfer the hammer control information HCINF using a mode register set (MRS) write command. The memory device may store the hammer control information HCINF in the mode register, and the refresh controller in the memory device may vary the hammer ratio based on the hammer control information HCINF stored in the mode register in the variable hammer control mode VHCM.

Hereinafter, the fixed hammer control mode FHCM and the variable hammer control mode VHCM are described with reference to FIGS. 5 through 7. As described above, the memory controller may generate refresh commands REF through a command signal CMD, and the memory device may perform a refresh operation RFO including a normal refresh operation NRO and a hammer refresh operation HRO during a refresh cycle time tRFC from a time point when each refresh command REF is received. In an example embodiment, the issuance of other commands is inhibited during the refresh cycle time tRFC.

Figure 5:
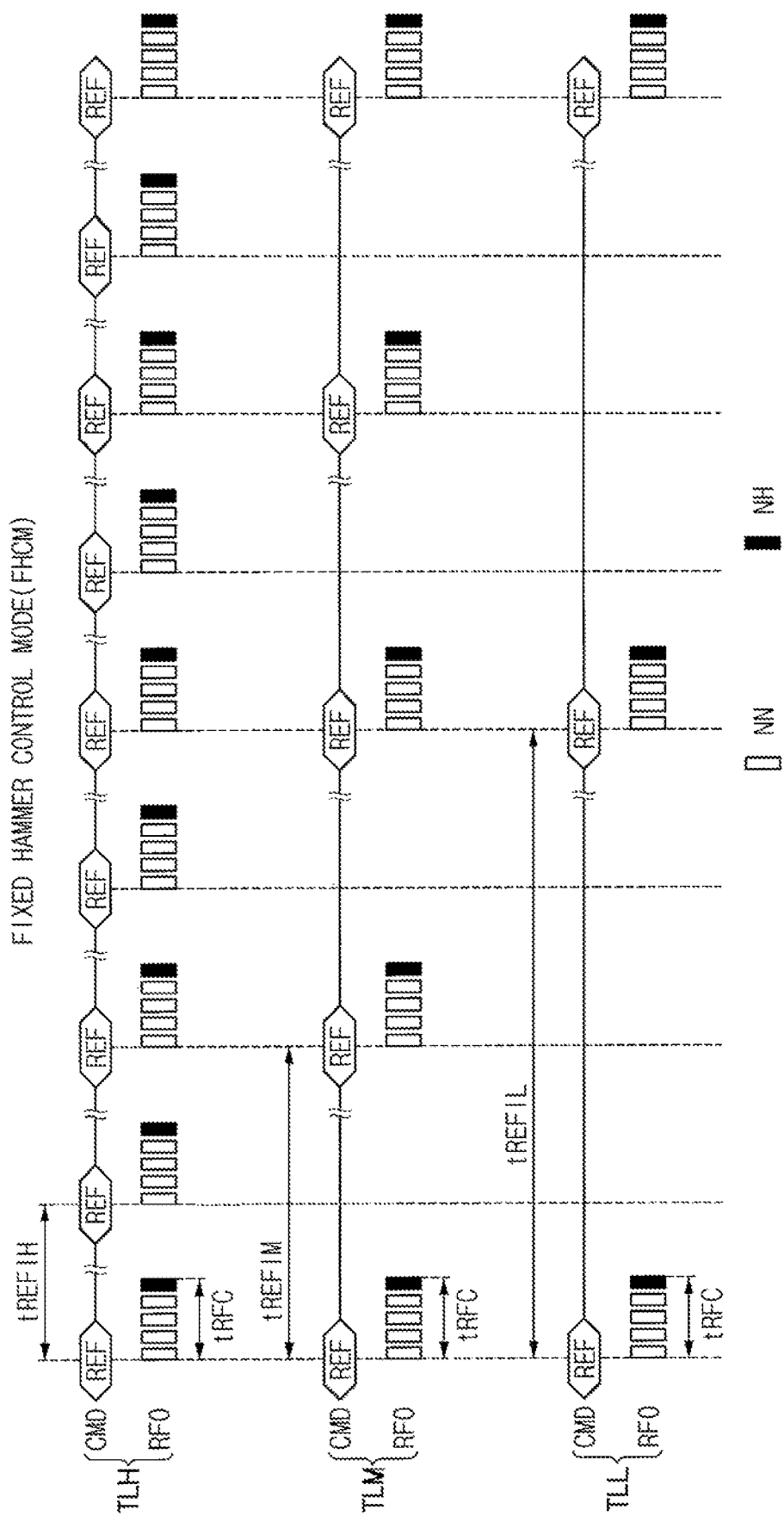
FIG. 5 is a timing diagram illustrating an example of a fixed hammer control mode of a memory device according to example embodiments.
Figure 6:
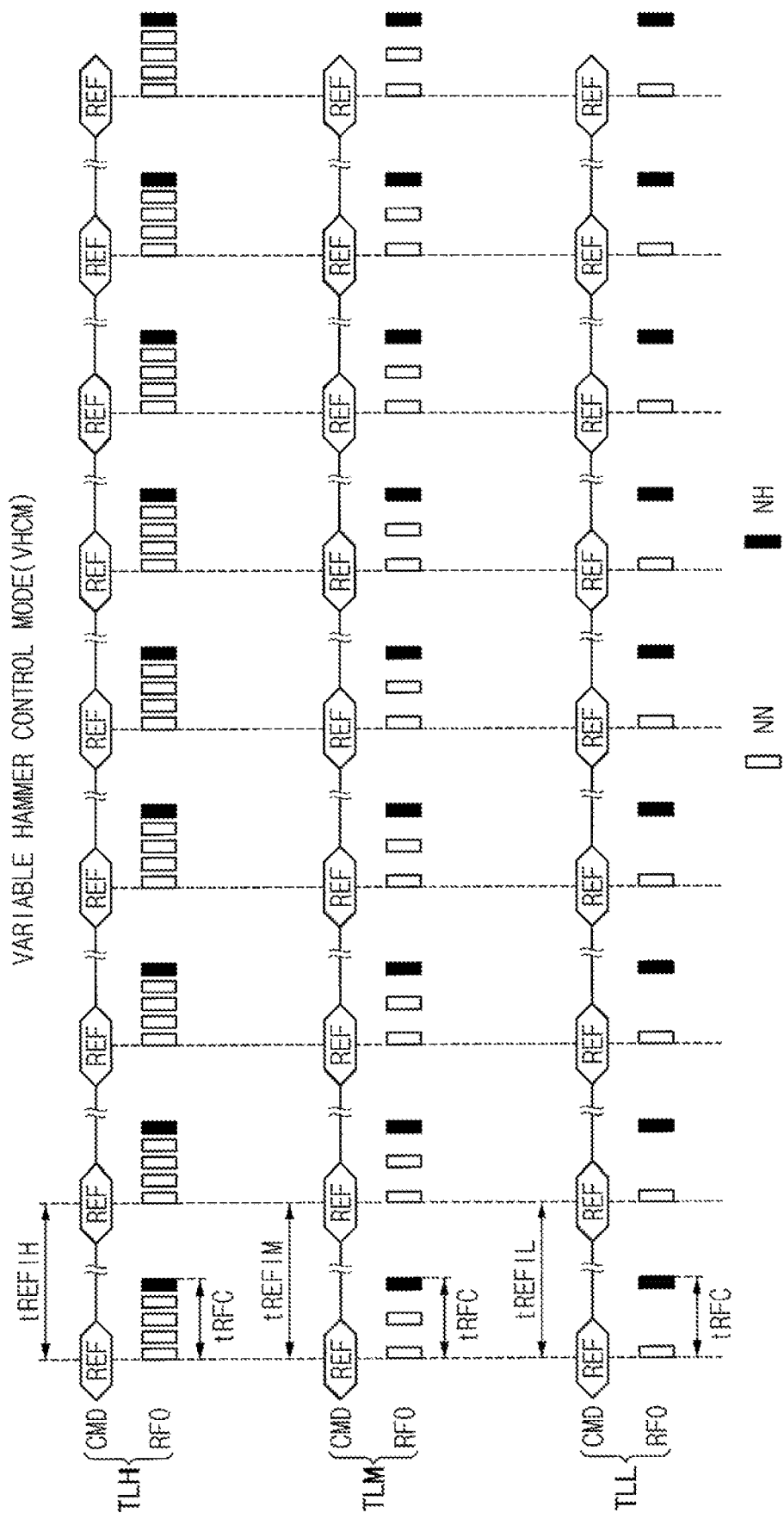
FIGS. 6 and 7 are diagrams illustrating an example of a variable hammer control mode of a memory device according to example embodiments.
Figure 7:
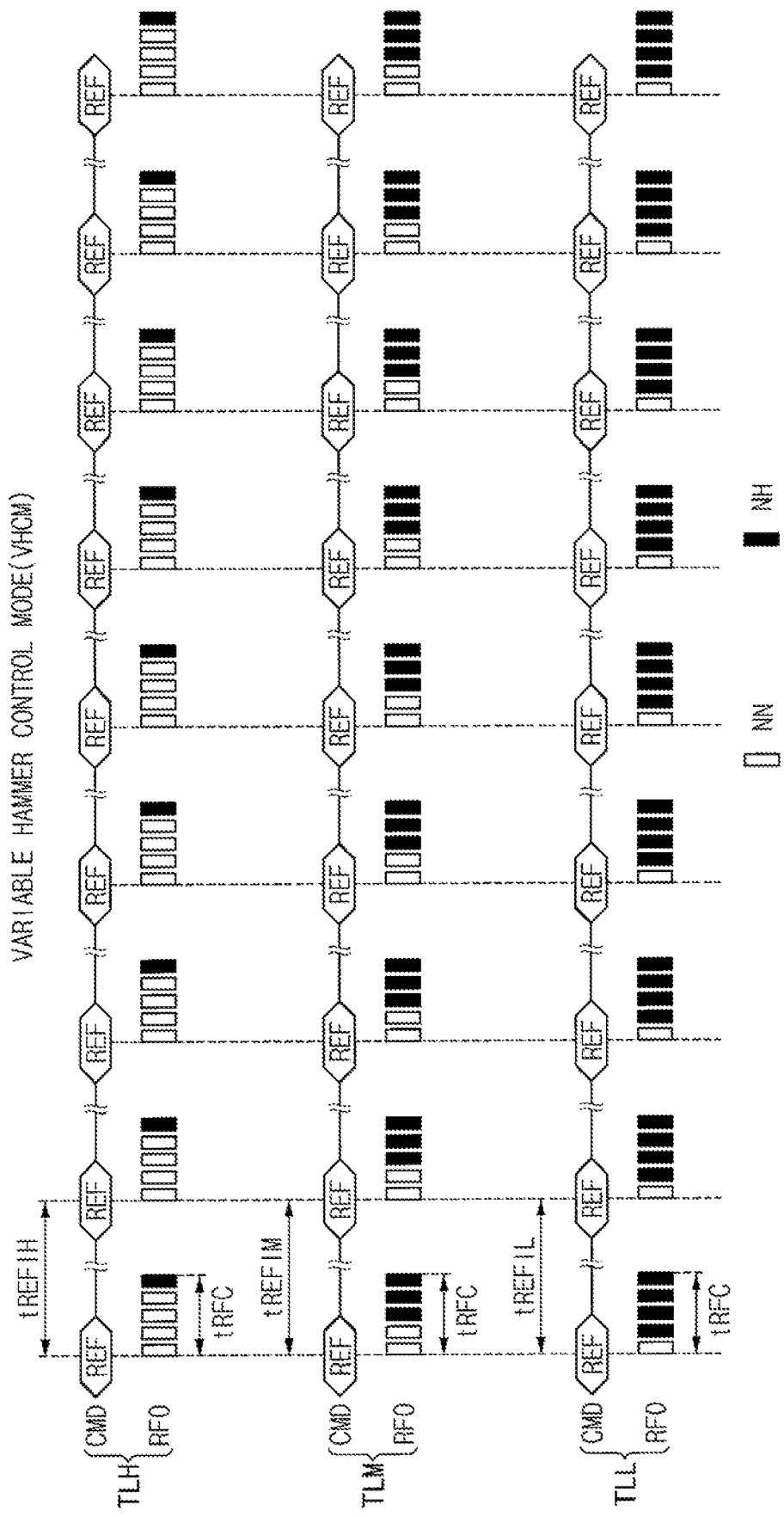

For convenience of description, example embodiments of FIGS. 5 through 7 are described based on the example temperature levels of FIG. 3. Example embodiments are described in connection with the numbers of the normal refresh operation NRO and the hammer refresh operation HRO illustrated in FIGS. 5 through 7 and mentioned values of times tREFIH (average refresh interval for TLH), tREFIM (average refresh interval for TLM), tREFIL (average refresh interval for TLL), and tRFC (refresh cycle time).

FIG. 5 is a timing diagram illustrating an example embodiment of a fixed hammer control mode FHCM of a memory device according to example embodiments.

Referring to FIG. 5, in the fixed hammer control mode FHCM, the memory controller may vary the average refresh interval such that the average refresh interval tREFIM (corresponding to the middle temperature level TLM) is longer than the average refresh interval tREFIH (corresponding to the high temperature level TLH), and the average refresh interval tREFIL (corresponding to the low temperature level TLL) is longer than the average refresh interval tREFIM (corresponding to the middle temperature level TLM).

In the example embodiment shown in FIG. 2, the refresh window tREFW may be 16 ms at the high temperature level TLH, 32 ms at the middle temperature level TLM, and 64 ms at the low temperature level TLL. The average refresh interval tREFI may be 3.9 µs at the high temperature level TLH (tREFIH), 7.8 µs at the middle temperature level TLM (tREFIM), and 17.6 µs at the low temperature level TLL (tREFIL). Thus, the number of the refresh commands REF included in the respective refresh window tREFW of the high temperature level TLH, the middle temperature level TLM, and the low temperature level TLL may be 8,192, and equal to each other regardless of the temperature levels.

As such, the memory controller may increase the average refresh interval corresponding to the second temperature level of the lower temperature range to be longer than the average refresh interval corresponding to the first temperature level of the higher temperature range.

In the fixed hammer control mode FHCM, the refresh controller in the memory device may maintain a unit normal execution number (NN) of the normal refresh operation NRO executed during the refresh cycle time tRFC and maintain a unit hammer execution number (NH) of the hammer refresh operation HRO executed during the refresh cycle time tRFC, regardless of the operation temperature.

For example, in the fixed hammer control mode FHCM illustrated in FIG. 5, in the refresh cycle time tRFC, the unit normal execution number NN of the normal refresh operation executed NRO may be fixed to four, and the unit hammer execution number NH of the hammer refresh operation HRO may be fixed to one, regardless of the high temperature level TLH, the middle temperature level TLM, or the low temperature level TLL.

FIGS. 6 and 7 are diagrams illustrating example embodiments of a variable hammer control mode VHCM of a memory device according to example embodiments.

Referring to FIGS. 6 and 7, in the variable hammer control mode VHCM, the memory controller may maintain the average refresh interval tREFI regardless of the operation temperature. In other words, the average refresh interval tREFIH corresponding to the high temperature level TLH, the average refresh interval tREFIM corresponding to the middle temperature level TLM, and the average refresh interval tREFIL corresponding to the low temperature level TLL may be equal to each other.

For example, the refresh window tREFW as described with reference to FIG. 2 may be 16 ms at the high temperature level TLH, 32 ms at the middle temperature level TLM, and 64 ms at the low temperature level TLL. In contrast, the average refresh intervals tREFIH, tREFIM, and the tREFIL may be set equal to 3.9 µs, regardless of the high temperature level TLH, the middle temperature level TLM, or the low temperature level TLL. In this case, the number of the refresh command included in the respective refresh window tREFW may be 8,192 for the high temperature level TLH, 2*8,192 for the middle temperature level TLM, and 4*8,192 for the low temperature level TLL.

As such, the memory controller may maintain the average refresh interval tREFI regardless of the first temperature level corresponding to the higher temperature range and the second temperature level corresponding to the lower temperature range in the variable hammer control mode VHCM.

In comparison with the fixed hammer control mode FHCM of FIG. 5, the memory controller operating in the variable hammer control mode VHCM in the example embodiment in FIG. 6 may transfer more refresh commands REF within the refresh window tREFW when the temperature level corresponds to the lower temperature range. The hammer ratio NH/NN (of the unit hammer execution number NH with respect to the unit normal execution number NN) may be varied in the variable hammer control mode VHCM using the increased number of the refresh commands REF.

In some example embodiments, in the variable hammer control mode VHCM, the refresh controller may vary the unit normal execution number NN such that the unit normal execution number NN corresponding to the second temperature level is smaller than the unit normal execution number NN corresponding to the first temperature level, and maintain the unit hammer execution number NH regardless of the first temperature level and the second temperature level. For example, referring to FIG. 6, the refresh controller may decrease the unit normal execution number NN when the temperature level corresponds to the lower temperature range such that the unit normal execution number NN is four for the high temperature level TLH, two for the middle temperature level TLM, and one for the low temperature level TLL. In contrast, the unit hammer execution number NH may be maintained to one regardless of the high temperature level TLH, the middle temperature level TLM, or the low temperature level TLL.

In some example embodiments, in the variable hammer control mode VHCM, the refresh controller may vary the unit normal execution number NN such that the unit normal execution number NN corresponding to the second temperature level is smaller than the unit normal execution number NN corresponding to the first temperature level, and vary the unit hammer execution number NH such that the unit hammer execution number NH corresponding to the second temperature level is greater than the unit hammer execution number NH corresponding to the first temperature level.

For example, referring to FIG. 7, the refresh controller may decrease the unit normal execution number NN when the temperature level corresponds to the lower temperature range such that the unit normal execution number NN is four for the high temperature level TLH, two for the middle temperature level TLM, and one for the low temperature level TLL, while the unit hammer execution number NH may be increased when the temperature level corresponds to the lower temperature range such that the unit normal execution number NN is one for the high temperature level TLH, three for the middle temperature level TLM, and four for the low temperature level TLL.

As such, the refresh controller may vary the hammer ratio NH/NN in the variable hammer control mode VHCM such that the hammer ratio NH/NN corresponding to the second temperature level (i.e., the lower temperature range) is higher than the hammer ratio NH/NN corresponding to the first temperature level (i.e., the higher temperature range). Thus, data loss of data stored in the memory cells due to a hammer attack (that is, frequent access to the memory cells or the wordline) may be prevented efficiently by adopting the variable hammer ratio NH/NN depending on the operation temperature. Thus, and operation reliability of the memory device and the memory system may be enhanced.

In some example embodiments, the refresh controller may vary the hammer ratio NH/NN based on the temperature information provided from the temperature sensor in the variable hammer control mode VHCM.

In some example embodiments, the refresh controller may vary the hammer ratio NH/NN based on the hammer control information HCINF provided from the memory controller. The memory controller may transfer the hammer control information HCINF using a mode register set (MRS) write command based on the temperature information provided from the memory device, and the memory device may store the hammer control information HCINF in a mode register included in a mode register set (see 412 in FIG. 9). As described with reference to FIG. 4, the hammer control information HCINF may include the mode information MD and the hammer ratio information HMRT.

Figure 8:
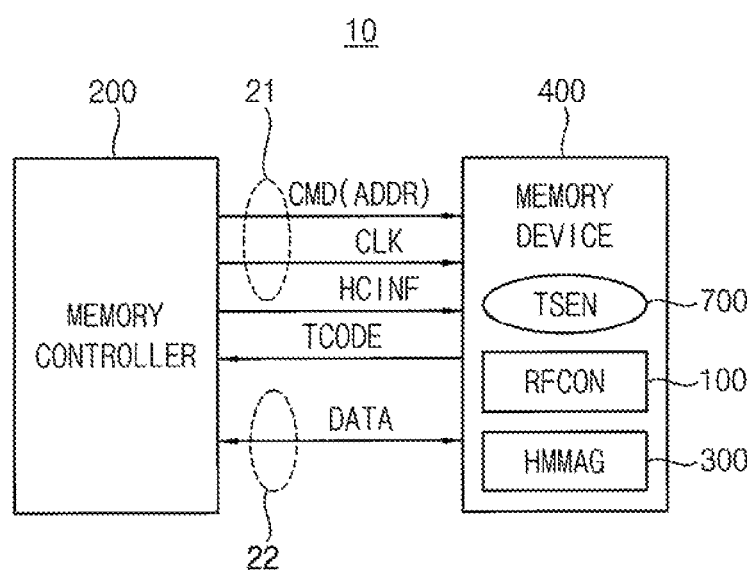
FIG. 8 is a block diagram illustrating a memory system according to example embodiments.

FIG. 8 is a block diagram illustrating a memory system according to example embodiments.

Referring to FIG. 8, a memory system 10 may include a memory controller 200 and a memory device 400. The memory controller 200 and the memory device 400 may include respective interfaces for mutual communication. The interfaces may be connected through a control bus 21 for transferring a command CMD, an address ADDR, a clock signal CLK, etc., and a data bus 22 for transferring data. According to some standards for memory devices, the address ADDR may be incorporated in the command CMD. The memory controller 200 may generate the command CMD to control the memory device 400, and the data may be written to or read from the memory device 400 under the control of the memory controller 200.

The memory device 400 may include a refresh controller RFCON 100, a hammer address manager HMMAG 300, and a temperature sensor TSEN 700. The hammer address manager 300 may manage access addresses synthetically with respect to a plurality of memory banks of the memory device 400, and provide a hammer address for a hammer refresh operation among the access addresses, where the hammer address is an address that is accessed intensively. The refresh controller 100 may generate a hammer refresh address signal based on the hammer address, where the hammer refresh address signal represents a row (or a victim wordline) that is physically adjacent to a row (or a hammer wordline) corresponding to the hammer address.

The temperature sensor 700 may provide temperature information by measuring an operation temperature of the memory cell array included in the memory device 400. The temperature sensor 700 may convert analog temperature information to the digital temperature code TCODE, and provide the temperature code TCODE to the memory controller 200 and/or the refresh controller 100. The memory controller 200 may generate the hammer control information HCINF based on the temperature code TCODE, and provide the hammer control information HCINF to the memory device 400.

Figure 9:
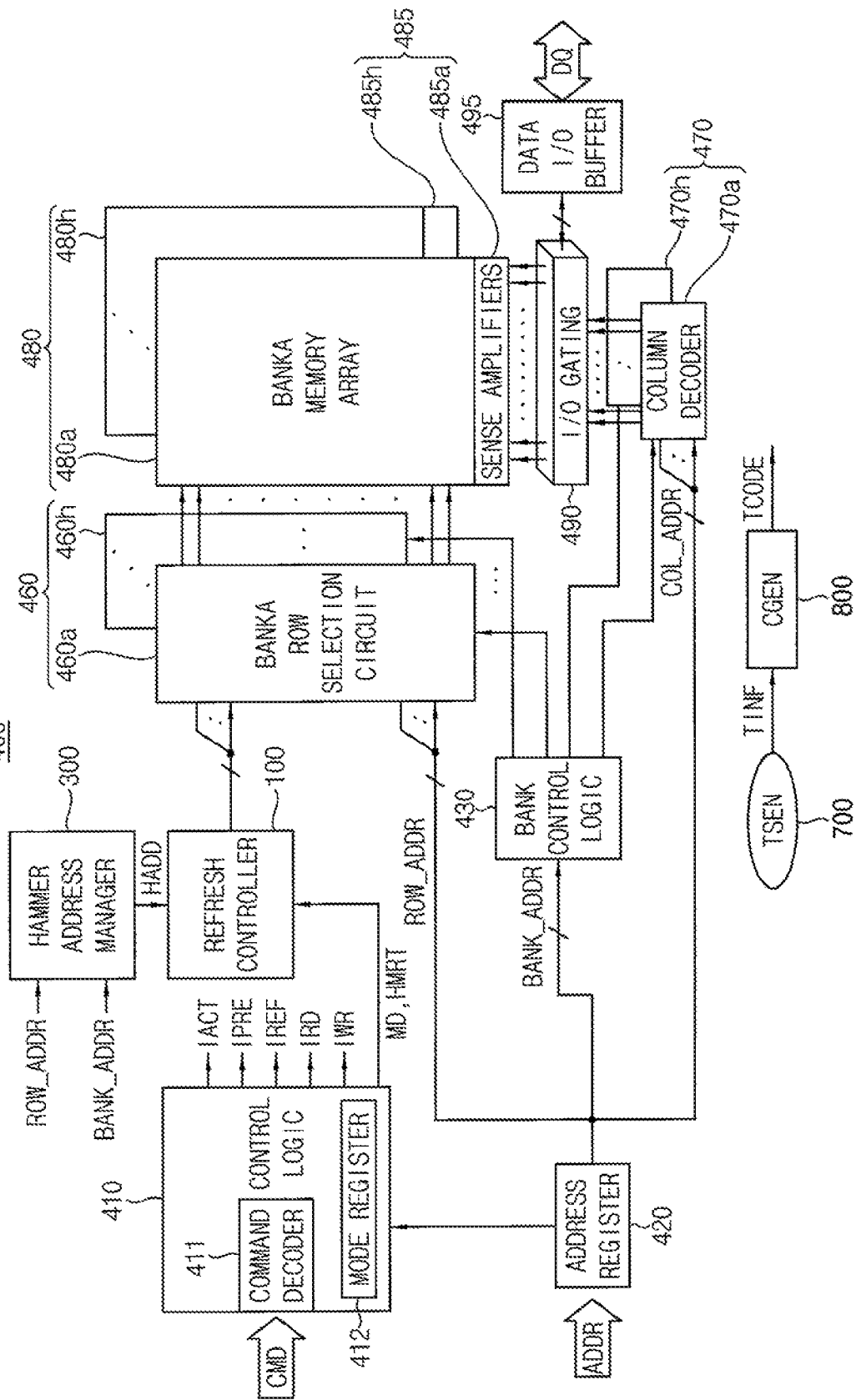
FIG. 9 is a block diagram illustrating a memory device according to example embodiments.

FIG. 9 is a block diagram illustrating a memory device according to example embodiments.

Referring to FIG. 9, a memory device 400 may include a control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, refresh controller 100, a hammer address manager 300, a temperature sensor TSEN 700, and a code generator CGEN 800. As used herein, a "unit" may refer to a "circuit."

The memory cell array 480 may include a plurality of bank arrays 480a~480h. The row selection circuit 460 may include a plurality of bank row selection circuits 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR, and a column address COL_ADDR from the memory controller 200. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a~460h corresponding to the bank address BANK_ADDR may be activated in response to the bank control signals, and one of the bank column decoders 470a~470h corresponding to the bank address BANK_ADDR may be activated in response to the bank control signals.

The row address ROW_ADDR from the address register 420 may be applied to the bank row selection circuits 460a~460h. The activated one of the bank row selection circuits 460a~460h may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some example embodiments, in a burst mode, the column address latch may generate column addresses that increment from the received column address COL_ADDR. The column address latch may apply the temporarily stored or generated column address to the bank column decoders 470a~470h.

The activated one of the bank column decoders 470a~470h may decode the column address COL_ADDR, and may control the I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~485h coupled to the one bank array from which the data is to be read, and may be stored in the read data latches. The data stored in the read data latches may be provided to the memory controller 200 via the data I/O buffer 495. Data DQ to be written in one bank array of the bank arrays 480a~480h may be provided to the data I/O buffer 495 from the memory controller 200. The write driver may write the data DQ in one bank array of the bank arrays 480a~480h.

The control logic 410 may control operations of the memory device 400. For example, the control logic 410 may generate control signals for the memory device 400 in order to perform a write operation, a read operation, or a refresh operation. The control logic 410 may generate internal command signals such as an active signal TACT, a precharge signal IPRE, a refresh signal IREF, a read signal IRD, a write signal IWR, etc., based on commands CMD transferred from the memory controller 200 in FIG. 8. The control logic 410 may include a command decoder 411 that decodes the commands CMD received from the memory controller 200 and a mode register set 412 that sets an operation mode of the memory device 400.

Although FIG. 9 illustrates the control logic 410 and the address register 420 as being distinct from each other, the control logic 410 and the address register 420 may be implemented as a single integrated circuit. In addition, although FIG. 9 illustrates the command CMD and the address ADDR being provided as distinct signals, the command CMD and the address ADDR may be provided as a combined signals, e.g., as specified by LPDDR5 standards.

The hammer address manager 300 may manage access addresses synthetically with respect to the plurality of bank arrays 480*a*~480*h* based on the bank address BANK_ADDR and the row address ROW_ADDR, and may provide a hammer address HADD for a hammer refresh operation among the access addresses, where the hammer address HADD is an address that is accessed intensively. The refresh controller 100 may generate a hammer refresh address signal based on the hammer address HADD, where the hammer refresh address signal represents a row (e.g., a victim wordline) that is physically adjacent to a row (e.g., a hammer wordline) corresponding to the hammer address HADD.

The temperature sensor 700 may generate temperature information TINF by measuring the operation temperature of the memory cell array 480. The code generator 800 may generate the temperature code TCODE by converting the temperature information TINF. The temperature sensor 700 may be an on-chip sensor integrated adjacent to the memory cell array 480 or a temperature sensor of other types. The temperature information TINF may be an analog signal, and the code generator 800 may include an analog-to-digital converter to convert the analog signal to digital data. In some example embodiments, the code generator 800 may be included in the temperature sensor 700 or the memory controller 200 in FIG. 8.

Referring to FIGS. 8 and 9, in some example embodiments, the temperature code TCODE may be stored in one mode register in the mode register set 412, and may be provided through the data bus 22 to the memory controller 200 by an MRS read command. In some example embodiments, the temperature code TCODE may be provided to the memory controller 200 through signal lines distinct from the control bus 21 and the data bus 22.

As described above, the memory controller 200 may generate the hammer control information HCINF including the mode information MD and the hammer ratio information HMRT based on the temperature code TCODE. The memory controller 200 may transfer the hammer control information HCINF through the data bus 22 to the memory device 400 by an MRS write command. The control logic 410 in the memory device 400 may store the hammer control information HCINF in one mode register of the mode register set 412. The control logic 410 may provide the hammer control information HCINF, that is, the mode information MD and the hammer ratio information HMRT, to the refresh controller 100. The refresh controller 100 may vary the hammer ratio NH/NN based on the hammer control information HCINF in the variable hammer control mode VHCM, as described above.

Figure 10:
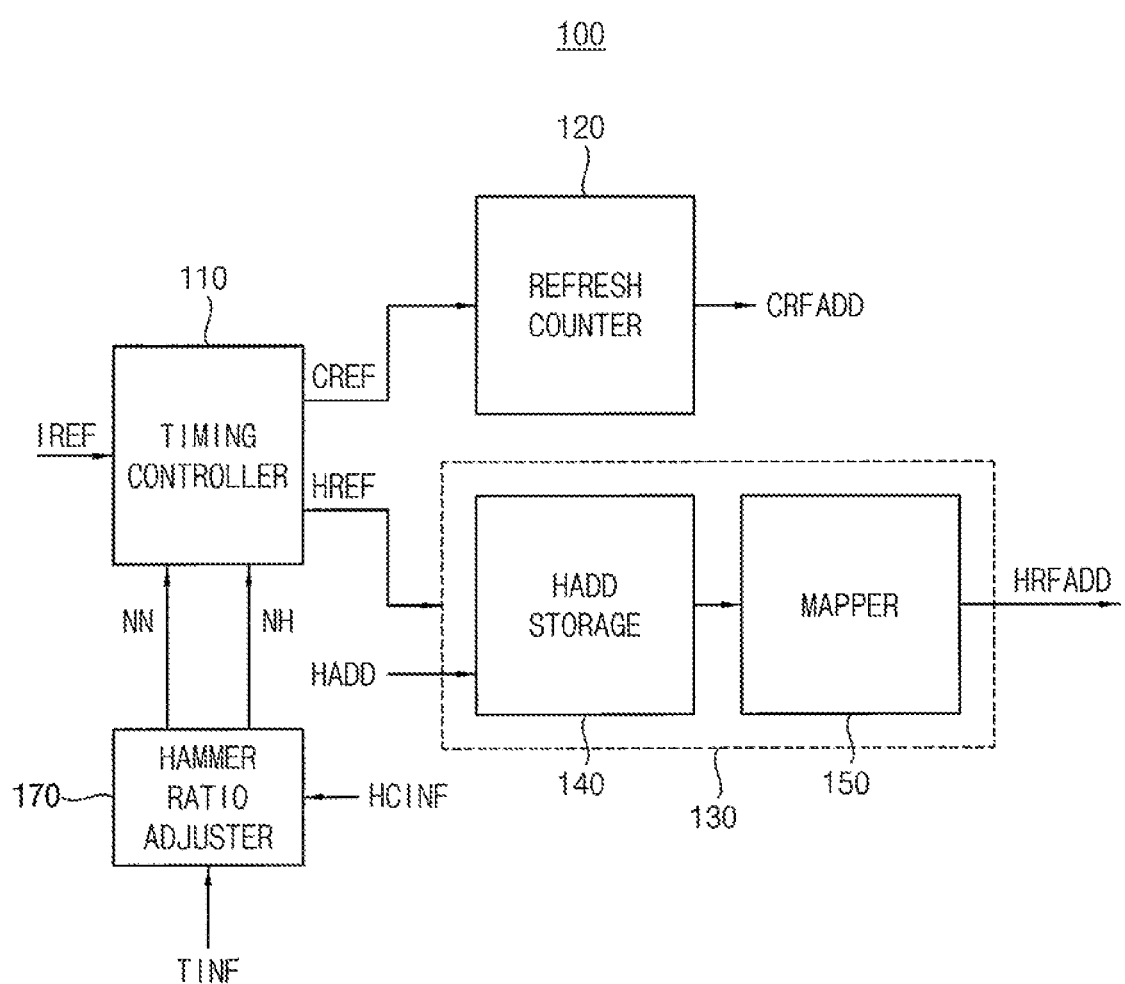
FIG. 10 is a block diagram illustrating an example embodiment of a refresh controller included in the memory device of FIG. 9.

FIG. 10 is a block diagram illustrating an example embodiment of the refresh controller 100 included in the memory device 400 of FIG. 9.

Referring to FIG. 10, the refresh controller 100 may include a timing controller 110, a refresh counter 120, an address generator 130, and a hammer ratio adjuster 170.

The hammer ratio adjuster 170 may determine the hammer ratio NH/NN of the unit hammer execution number NH with respect to the unit normal execution number NN, based on the temperature information TINF and/or the hammer control information HCINF. The hammer ratio adjuster 170 may provide the unit normal execution number NN and the unit hammer execution number NH corresponding to the determined hammer ratio NH/NN to the timing controller 110. An example embodiment of the hammer ratio adjuster 170 will be described below with reference to FIG. 11. The hammer ratio adjuster 170 may receive the temperature code TCODE instead of the temperature information TINF.

The timing controller 110 may generate a counter refresh signal CREF (representing a timing of a normal refresh operation) and a hammer refresh signal HREF (representing a timing of a hammer refresh operation) based on a refresh signal IREF (representing a timing of receiving refresh commands REF), the unit normal execution number NN, and the unit hammer execution number NH. As will be described below with reference to FIGS. 12 through 15, the timing controller 110 may selectively activate the counter refresh signal CREF or the hammer refresh signal HREF.

Referring to FIG. 10, in some example embodiments the timing controller 110 may be included in the refresh controller 100. In other example embodiments, the timing controller 110 may be omitted from the refresh controller 100, and the counter refresh signal CREF and the hammer refresh signal HREF may be provided from other control logics in the memory device 400.

The refresh counter 120 may generate a counter refresh address signal CRFADD in response to the counter refresh signal CREF. The counter refresh address signal CRFADD may represent a sequentially changing address. For example, the refresh counter 120 may increase a value of the counter refresh address signal CRFADD whenever the counter refresh signal CREF is activated. Wordlines in the memory cell array 480 of the memory device 400 may be selected sequentially for refresh operations by increasing the value of the counter refresh address signal CRFADD.

The address generator 130 may store the hammer address HADD provided from the hammer address manager 300, and may generate a hammer refresh address signal HRFADD in synchronization with the hammer refresh signal HREF. The hammer refresh address signal HRFADD may represent an address of a row that is physically adjacent to the row corresponding to the hammer address HADD. The address generator 130 may include a hammer address storage 140 and a mapper 150.

The hammer address storage 140 may store the hammer address HADD provided from hammer address manager 300. The mapper 150 may generate the hammer refresh address signal HRFADD based on the hammer address HADD provided from the hammer address storage 140. In some example embodiments, the hammer address storage 140 may be omitted, and the mapper 150 may receive the hammer address HADD directly from the hammer address manager 300. As will be described below with reference to FIG. 19, the hammer refresh address signal HRFADD may indicate an address of the row of the memory device 400 that is physically adjacent to the row of the memory device 400 corresponding to the hammer address HADD.

Figure 11:
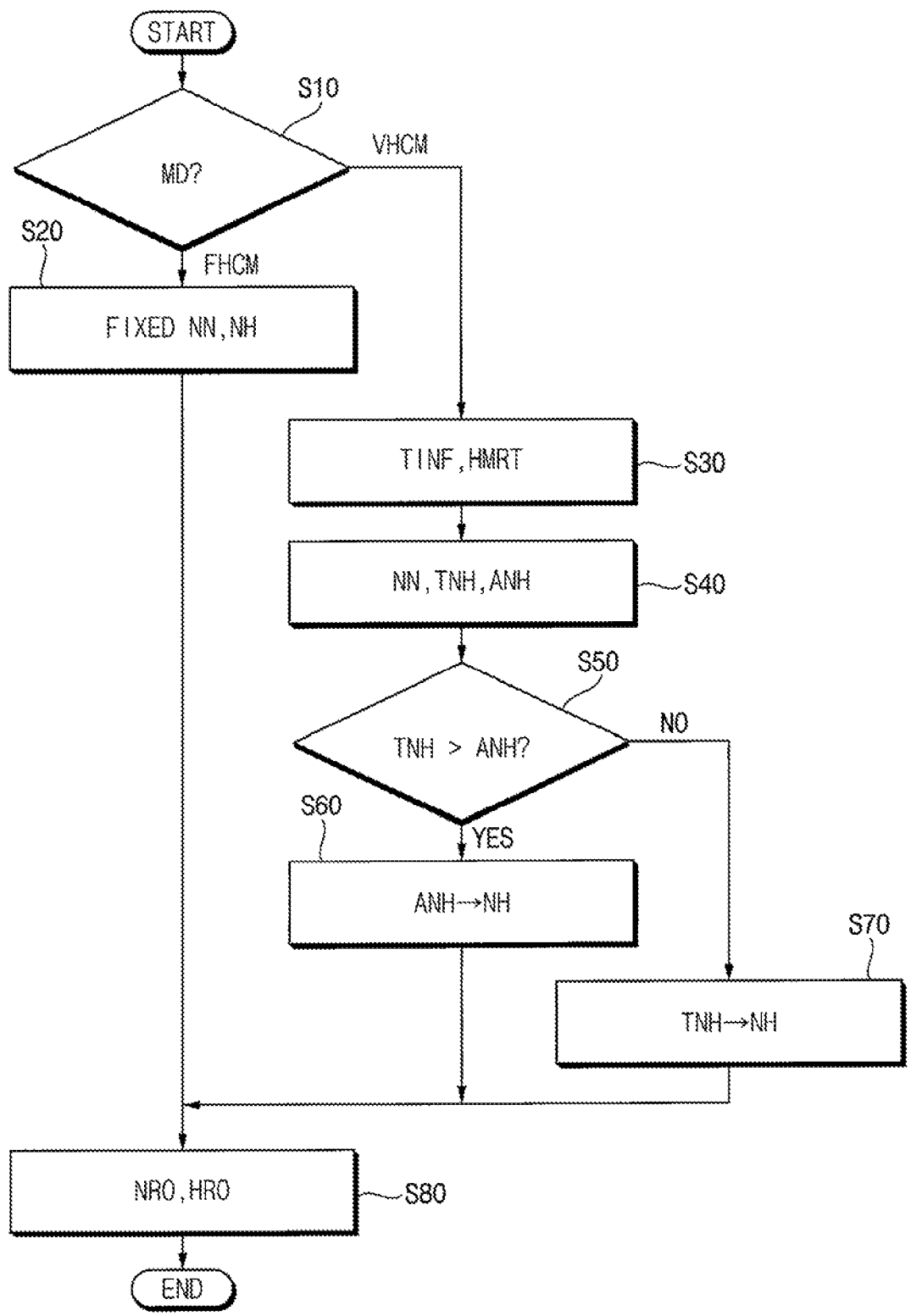
FIG. 11 is a flow chart illustrating a method of controlling refresh of a memory device according to example embodiments.

FIG. 11 is a flow chart illustrating a method of controlling refresh of a memory device according to example embodiments.

Referring to FIGS. 10 and 11, the refresh controller 100 may determine whether a present operation mode (MD) is the fixed hammer control mode FHCM or the variable hammer control mode VHCM based on the mode information (S10).

When the present operation mode is the fixed hammer control mode FHCM, the hammer ratio adjuster 170 may provide the unit normal execution number NN and the unit hammer execution number NH, which are fixed, to the timing controller 110 (S20). The memory device, as described with reference to FIG. 5, may perform the normal refresh operation NRO corresponding to the fixed unit normal execution number NN and the hammer refresh operation HRO corresponding to the fixed unit hammer execution number NH during each refresh cycle time tRFC in the fixed hammer control mode FHCM (S80).

When the present operation mode (MD) is the variable hammer control mode VHCM, the hammer ratio adjuster 170 may receive the temperature information TINF and the hammer ratio information HMRT (S30), and determine the unit normal execution number NN, a target hammer execution number TNH, and an available hammer execution number ANH (S40). The target hammer execution number TNH may indicate a number of the hammer refresh operation HRO to be executed during the refresh cycle time tRFC. The available hammer execution number ANH may indicate a number of the hammer refresh operation HRO executable during the refresh cycle time tRFC.

The target hammer execution number TNH may be determined based on the hammer ratio information HMRT included in the hammer control information HCINF.

The memory controller 200 may determine the hammer ratio information HMRT based on the operation temperature of the memory cell array 480 and/or the importance degree of data stored in the memory cell array 480. For example, the larger value of the hammer ratio information HMRT may indicate the larger number of the hammer refresh operations HRO to be executed during each refresh cycle time tRFC. The available hammer execution number ANH may correspond to a difference between the unit normal execution number NN and a total number of the refresh operations executable during each refresh cycle time tRFC.

The hammer ratio adjuster 170 may compare the target hammer execution number TNH with the available hammer execution number ANH (S50). The hammer ratio adjuster 170 may determine the available hammer execution number ANH as the unit hammer execution number NH (S60) when the target hammer execution number TNH is greater than the available hammer execution number ANH (S50: YES), and determine the target hammer execution number TNH as the unit hammer execution number NH (S70) when the target hammer execution number TNH is equal to or smaller than the available hammer execution number ANH (S50: NO). The memory device, as described with reference to FIGS. 6 and 7, may perform the normal refresh operation NRO (corresponding to the unit normal execution number NN) and the hammer refresh operation HRO (corresponding to the fixed unit hammer execution number NH) during each refresh cycle time tRFC in the variable hammer control mode VHCM (S80).

FIGS. 12 through 15 are timing diagrams illustrating example embodiments of a variable hammer control mode of a memory device according to example embodiments. For convenience of illustration, FIGS. 12 through 15 illustrate operations corresponding to one average refresh interval tREFI between the two adjacent refresh commands REF.

Referring to FIGS. 10 through 15, the timing controller 110 may generate a refresh clock signal RFCLK in response to the refresh signal IREF indicating the timing of receiving the refresh commands REF. The refresh clock signal RFCLK may toggle by the number of the refresh operation executable within the refresh cycle time tRFC. The timing controller 110 may generate the counter refresh signal CREF (representing the timing of the normal refresh operation NRO) and the hammer refresh signal HREF (representing the timing of the hammer refresh operation HRO) in synchronization with the refresh clock signal RFCLK, for each of the high temperature level TLH, the middle temperature level TLM, and the low temperature level TLL. The toggling number of the counter refresh signal CREF may correspond to the unit normal execution number NN. The toggling number of the hammer refresh signal HREF may correspond to the unit hammer execution number NN.

Figure 12:
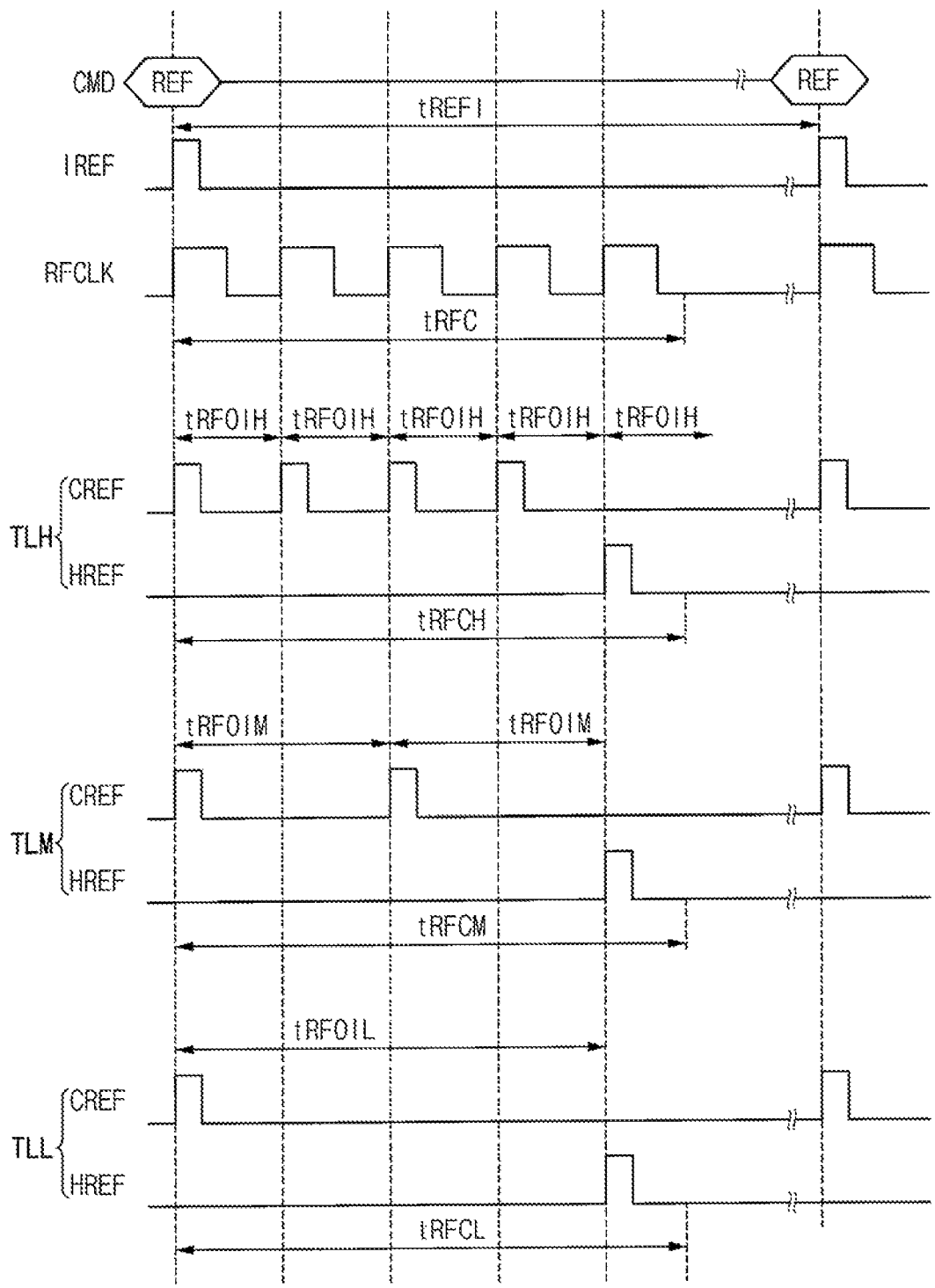
FIGS. 12 through 15 are timing diagrams illustrating examples of a variable hammer control mode of a memory device according to example embodiments.
Figure 13:
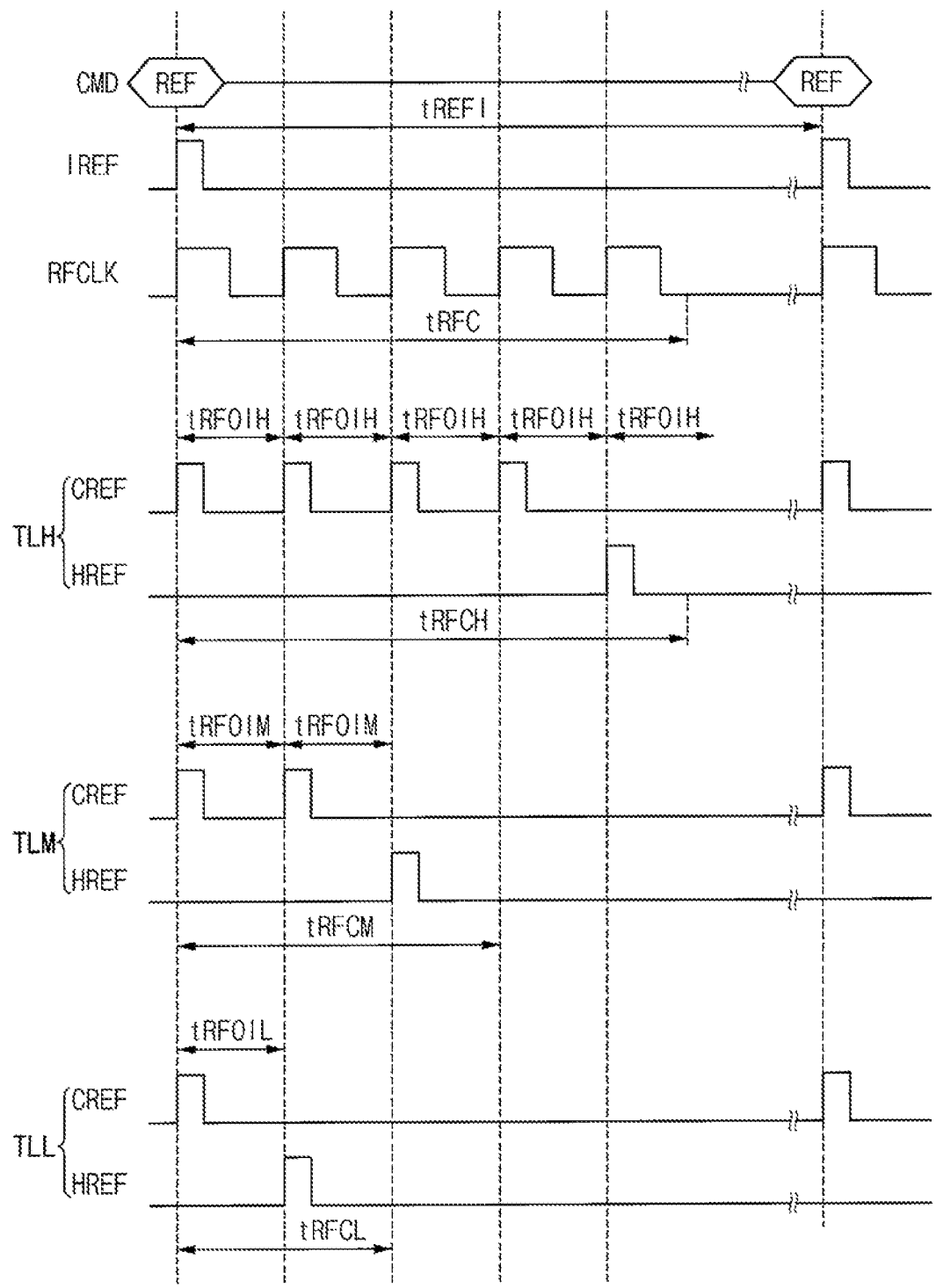
Figure 14:
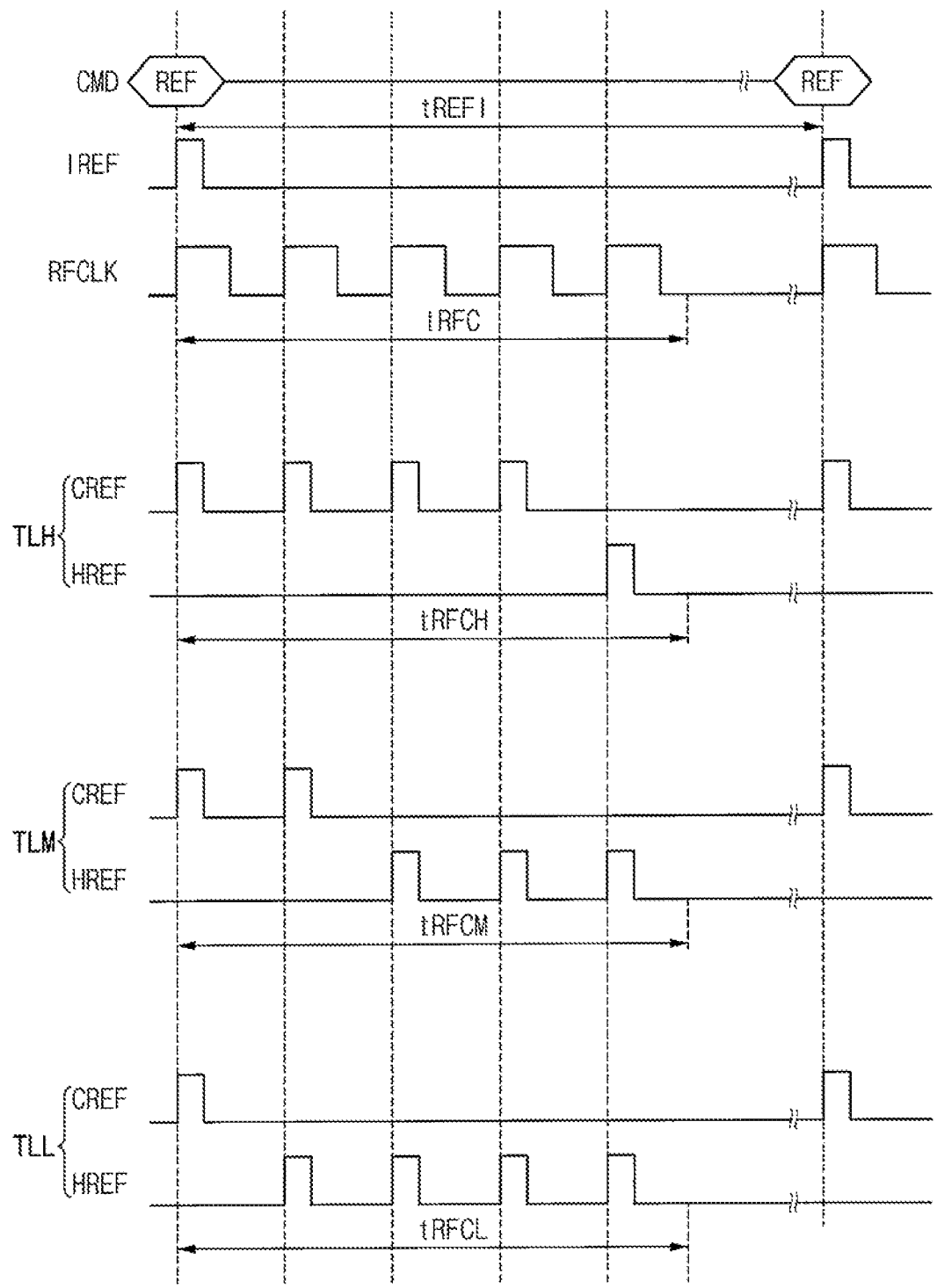
Figure 15:
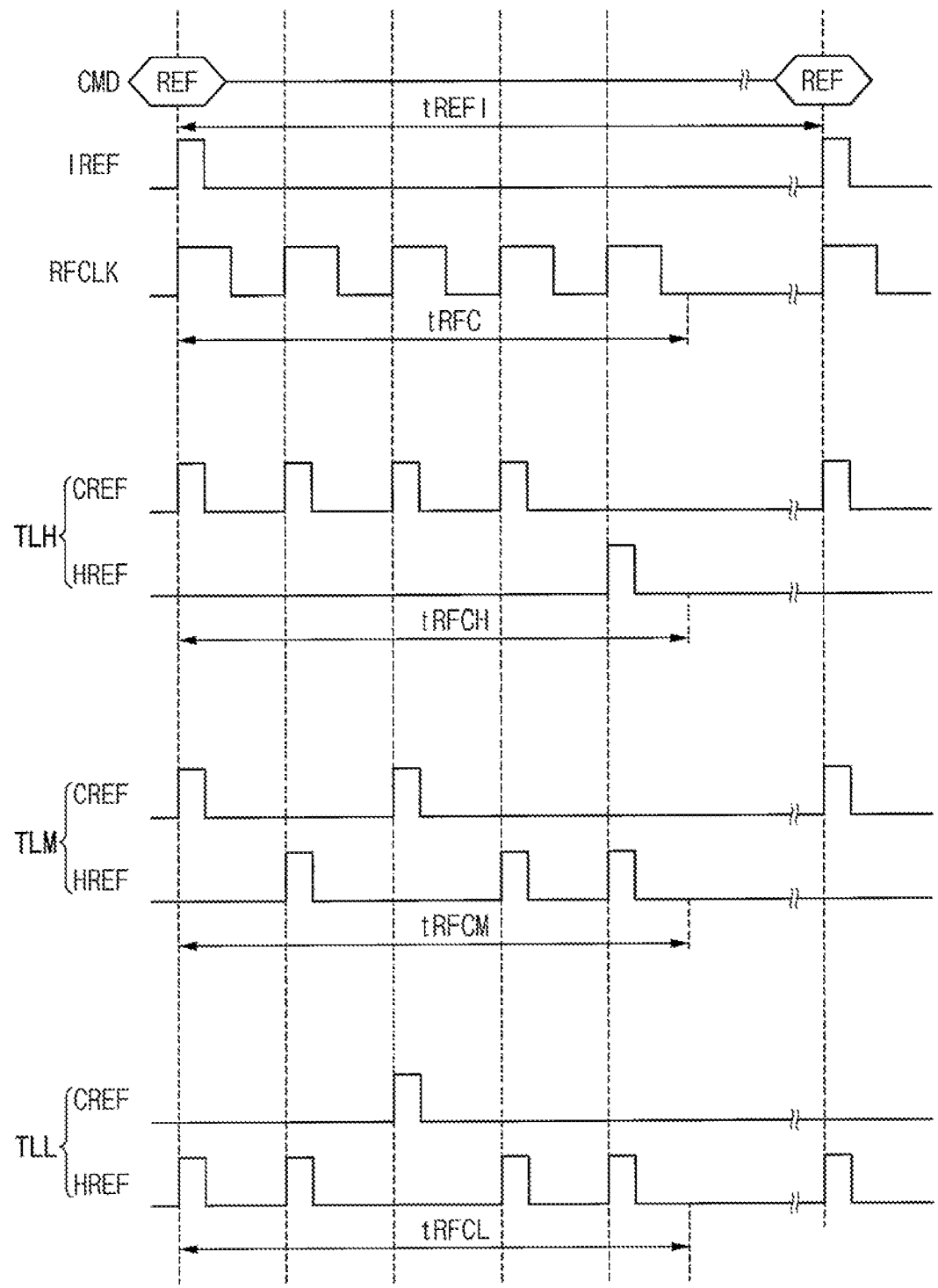

The operations of FIGS. 12 and 13 correspond to the operations in the variable hammer control mode VHCM as described above with reference to FIG. 6, and the operations of FIGS. 14 and 15 correspond to the operations in the variable hammer control mode VHCM as described above with reference to FIG. 7. Hereinafter, descriptions repeated with FIGS. 6 and 7 may be omitted.

Referring to FIG. 12, in some example embodiments the timing controller 110 may vary an operation interval indicating a time interval between two adjacent refresh operations such that an operation interval tRFOIM (corresponding to the middle temperature level TLM) is longer than an operation interval tRFOIH (corresponding to the high temperature level TLH), and an operation interval tRFOIL (corresponding to the low temperature level TLL) is longer than the operation interval tRFOIM (corresponding to the middle temperature level TLM). Thus, the timing controller 110 in the refresh controller 100 may vary the operation interval such that the operation interval corresponding to the second temperature level (i.e., the lower temperature range) is longer that the operation interval corresponding to the first temperature level (i.e., the higher temperature range).

Referring to FIG. 12, a refresh cycle time tRFCH (corresponding to the high temperature level TLH), a refresh cycle time tRFCM (corresponding to the middle temperature level TLM), and a refresh cycle time tRFCL (corresponding to the low temperature level TLL) may be equal to each other. Thus, the timing controller 110 may maintain the refresh cycle time regardless of the temperature levels in the variable hammer control mode VHCM.

Referring to FIG. 12, in some example embodiments the timing controller 110 may maintain the operation interval such that the operation interval tRFOIH (corresponding to the high temperature level TLH), the operation interval tRFOIM (corresponding to the middle temperature level TLM), and the operation interval tRFOIL (corresponding to the low temperature level TLL) are equal to each other. Thus, the timing controller 110 may maintain the operation interval regardless of the temperature levels in the variable hammer control mode VHCM.

Referring to FIG. 13, the refresh cycle time tRFCM (corresponding to the middle temperature level TLM) may be shorter than the refresh cycle time tRFCH (corresponding to the high temperature level TLH), and the refresh cycle time tRFCL (corresponding to the low temperature level TLL) may be shorter than the refresh cycle time tRFCM (corresponding to the middle temperature level TLM). Thus, the timing controller 110 may decrease the refresh cycle time for the temperature level of the lower temperature range. In other words, the timing controller 110 may vary the refresh cycle time such the refresh cycle time tRFC corresponding to the second temperature level (i.e., the lower temperature range) is shorter than the refresh cycle time tRFC corresponding to the first temperature level (i.e., the higher temperature range) in the variable hammer control mode VHCM. The time loss for the refresh operation may be decreased by decreasing the refresh cycle time tRFC depending on the temperature levels, and performance of the memory device and the memory system may be enhanced.

Referring to FIG. 14, in some example embodiments the normal refresh operation NRO (corresponding to the unit normal execution number NN) may be performed, and then the hammer refresh operation HRO (corresponding to the unit hammer execution number NH) may be performed after the normal refresh operation NRO.

Referring to FIG. 15, in some other example embodiments the order of the normal refresh operation NRO and the hammer refresh operation HRO may be varied.

Hereinafter, example embodiments of the hammer address manager 300 of FIG. 9 are described with reference to FIGS. 16 through 18.

Figure 16:
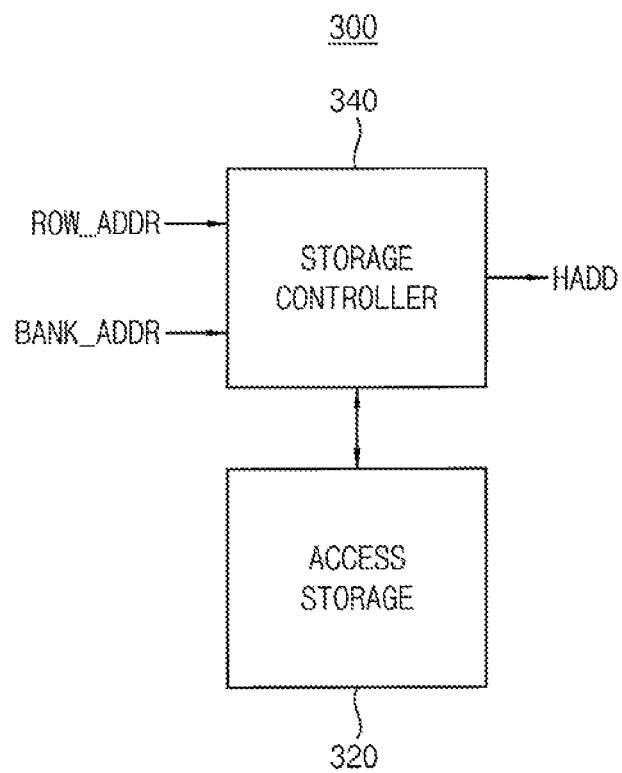
FIG. 16 is a block diagram illustrating an example embodiment of a hammer address manager included in the memory device of FIG. 9.
Figure 17:
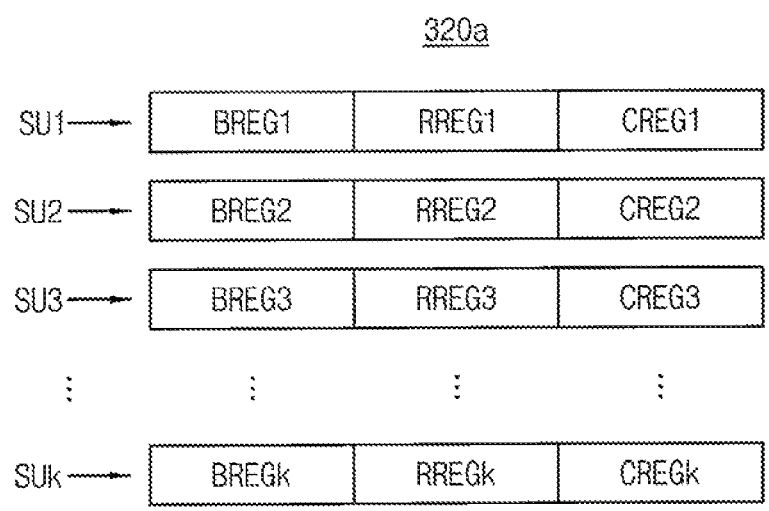
FIGS. 17 and 18 are diagrams illustrating example embodiments of an access storage included in the hammer address manager of FIG. 16.
Figure 18:
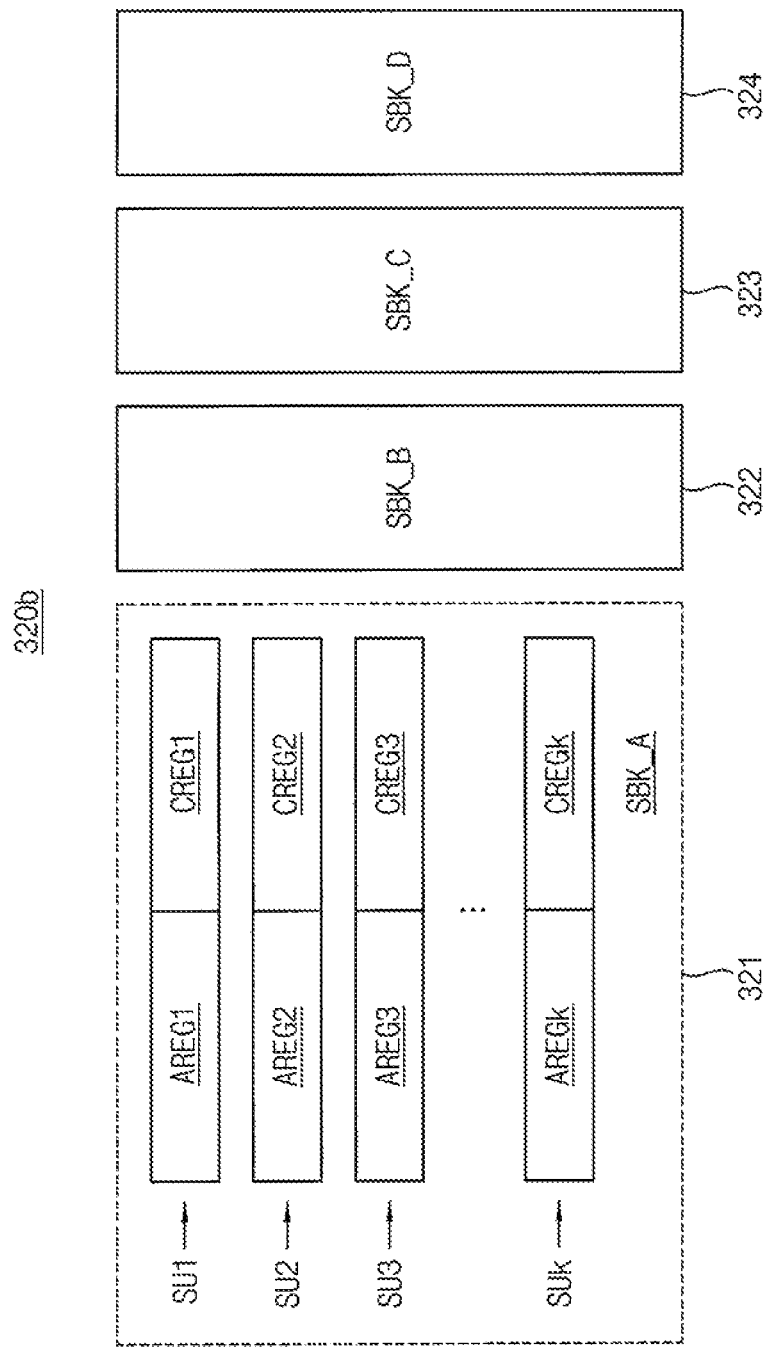

FIG. 16 is a block diagram illustrating an example embodiment of a hammer address manager 300 included in the memory device 400 of FIG. 9, and FIGS. 17 and 18 are diagrams illustrating example embodiments of the access storage 320 included in the hammer address manager 300 of FIG. 16.

Referring to FIG. 16, the hammer address manager 300 may include an access storage 320 and a storage controller 340.

The access storage 320 may store information with respect to the hammer address HADD that is accessed intensively or frequently. Referring to FIG. 17, in some example embodiments the access storage 320a may include a plurality of storage units SU1~SUk. Each storage unit SUi (i=1~k) may include a bank register BREGi to store the bank address of each access address, a row register RREGi to store the row address of each access address, and a count register CREGi to store each access count value.

The storage controller 340 may control the access storage 320 based on an access address signal BANK_ADDR and ROW_ADDR that is transferred from the memory controller 200 to the memory device 400. The access address may include the bank address signal BANK_ADDR and the row address signal ROW_ADDR. The storage controller 340 may determine and provide the hammer address HADD among the stored access addresses based on the access count values. The management scheme of the hammer address HADD used by the storage controller 340 may be determined variously depending on the memory system.

Referring to FIG. 18, in some example embodiments an access storage 320b may include a plurality of storage blocks SBK_A 321, SBK_B 322, SBK_C 323, and SBK_D 324, and each of the storage blocks 321~324 may include a plurality of storage units SU1~SUk. FIG. 18 illustrates a non-limiting example of the access storage 320b corresponding to four memory banks A, B, C, and D, but the number of the storage blocks may be changed depending on the configuration of the memory device. For example, if the memory device has a single-bank structure, the access storage 320b may include only one storage block 321. The storage blocks 321~324 may have substantially the same configuration, and thus, only the storage block 321 will be described.

The storage units SU1~SUk may each include address registers AREG1~AREGk, respectively, storing row addresses that are accessed, and count registers CREG1~CREGk, respectively, storing access count values corresponding to the row addresses.

The storage controller 340 in FIG. 16 may control the access storage 320 based on an access address signal that is transferred from the refresh controller 100 to the memory device. The access address signal may include a bank address BADD and a row address XADD. The bank address BADD may be omitted if the memory device has a single memory bank. The storage controller 340 may determine and provide the hammer address HADD among the stored access addresses based on the access count values.

Figure 19:
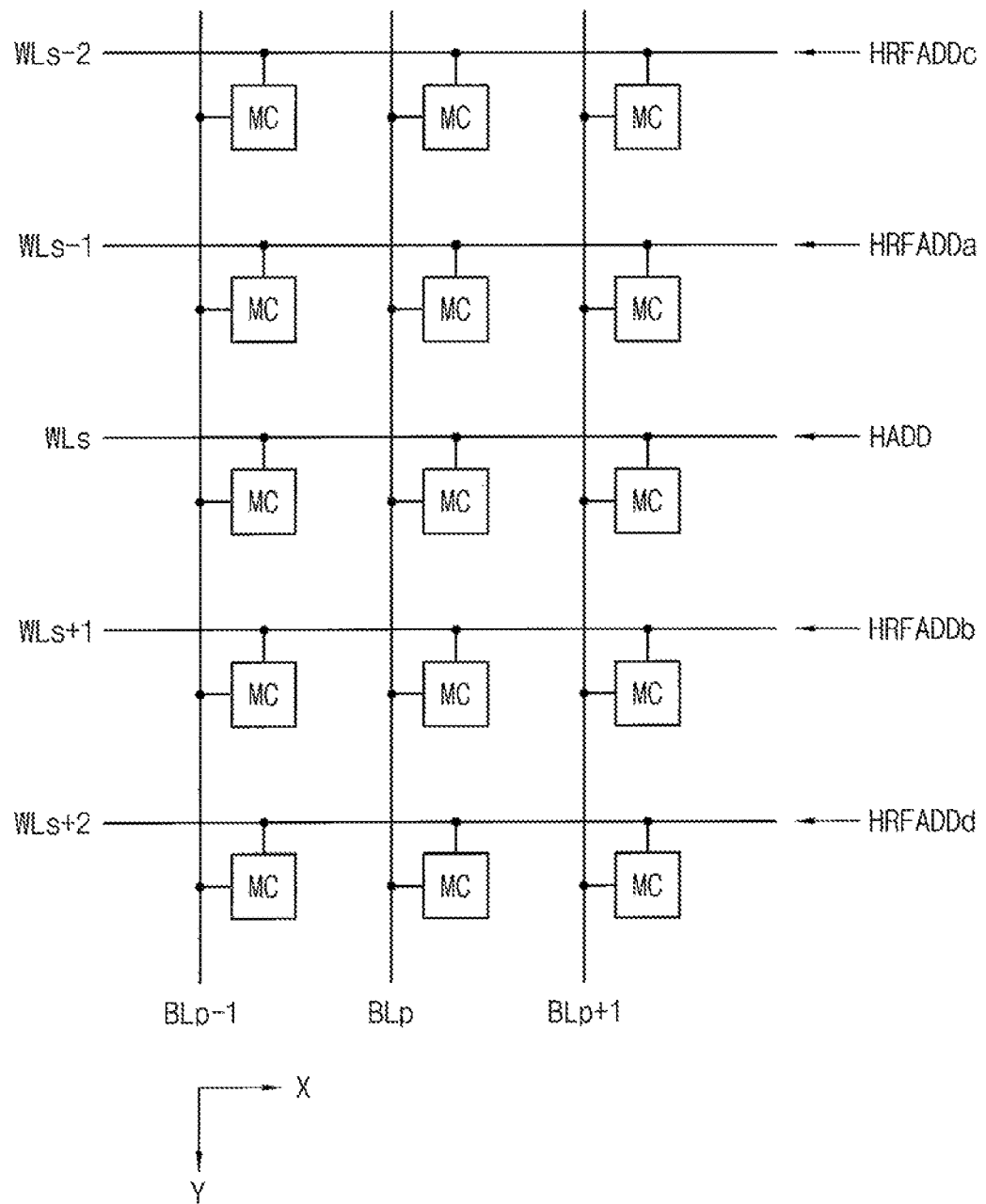
FIG. 19 is a diagram illustrating a portion of a memory cell array for describing a data loss due to wordline coupling.

FIG. 19 is a diagram illustrating a portion of a memory cell array for describing a data loss due to wordline coupling.

FIG. 19 illustrates five wordlines WLs−2, WLs−1, WLs, WLs+1, and WLs+2, three bitlines BLp−1, BLp, and BLp+1, and memory cells MC coupled to the wordlines WLs−2, WLs−1, WLs, WLs+1, and WLs+2 and the bitlines BLp−1, BLp, and BLp+1 in the memory cell array. The five wordlines WLs−2, WLs−1, WLs, WLs+1, and WLs+2 extend in a row direction (e.g., X direction) and are arranged sequentially along a column direction (e.g., Y direction). The three bitlines BLp−1, BLp, and BLp+1 extend in the column direction and are arranged sequentially along the row direction.

In an example embodiment, the middle wordline WLs may correspond to a hammer address HADD that has been accessed intensively. It will be understood that an intensively-accessed or hammer wordline refers to a wordline that has a relatively higher activation number and/or has a relatively higher activation frequency (e.g., greater than a predetermined threshold or greater than other access addresses). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−2, WLs−1, WLs+1, and WLs+2 to fluctuate as the voltage level of the hammer wordline WLs varies. Thus, the cell charges of the memory cells MC coupled to the adjacent wordlines WLs−2, WLs−1, WLs+1, and WLs+2 may be affected. As the hammer wordline WLs is accessed more frequently, the cell charges of the memory cells MC coupled to the adjacent wordlines WLs−2, WLs−1, WLs+1, and WLs+2 may be lost more rapidly.

The address generator 130 in FIG. 10 may provide the hammer refresh address signal HRFADD representing addresses HRFADDa, HRFADDb, HRFADDc, and HRFADDd of the rows (e.g., the wordlines WLs−1, WLs+1, WLs−2, and WLs+2) that are physically adjacent to the row of the hammer address HADD (e.g., the middle wordline WLs). A hammer refresh operation for the adjacent wordlines WLs−1, WLs+1, WLs−2, and WLs+2 may be performed based on (e.g., in response to) the hammer refresh address signal HRFADD to reduce or possibly prevent the loss of data stored in the memory cells MC. The hammer refresh operation may be performed with respect to the two wordlines WLs−1 and WLs+1 directly adjacent to the hammer wordline WLs, or with respect to the four wordlines WLs−2, WLs−1, WLs+1, and WLs+2 including the next adjacent wordlines WLs−2 and WLs+2.

Figure 20:
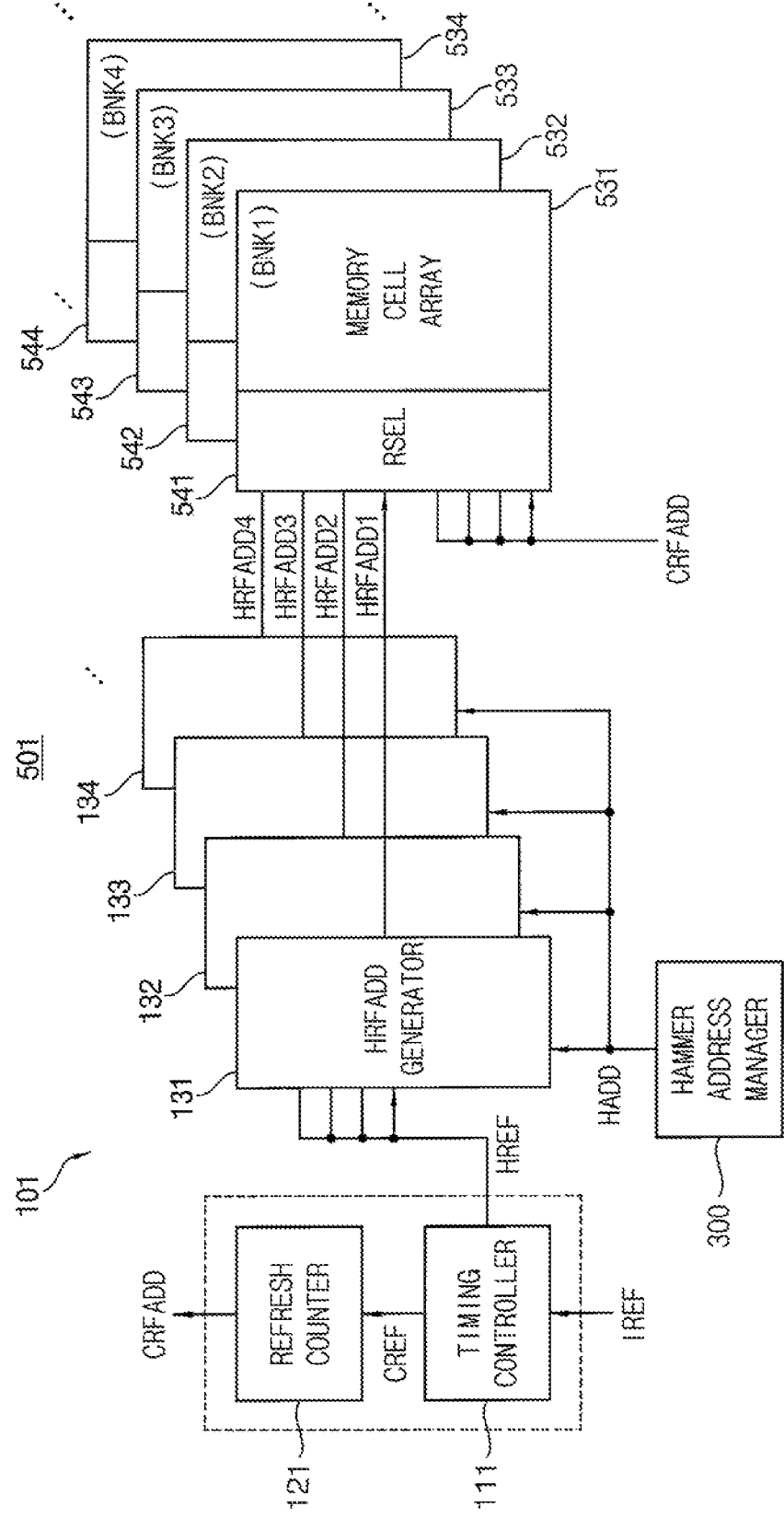
FIG. 20 is a block diagram illustrating a memory device according to example embodiments.

FIG. 20 is a block diagram illustrating a memory device according to example embodiments. FIG. 20 is provided for describing example embodiments of synthetically managing access addresses with respect to a plurality of memory banks, and some elements in FIG. 9 are omitted in FIG. 20.

Referring to FIG. 20, a memory device 501 has a multi-bank structure in which a memory cell array includes a plurality of memory banks 531, 532, 533, and 534. A refresh controller 101 according to example embodiments may include a timing controller 111, a refresh counter 121, and an address generator that includes a plurality of sub address generators 131, 132, 133, and 134.

The timing controller 111 may generate the counter refresh signal CREF and the hammer refresh signal HREF, which are activated selectively, based on the refresh signal IREF. The refresh counter 121 may generate the counter refresh address signal CRFADD in response to the counter refresh signal CREF such that the counter refresh address signal CRFADD represents a sequentially changing address. The sub address generators 131, 132, 133, and 134 may receive the hammer address HADD provided from the hammer address manager 300, and generate hammer refresh address signals HRFADD1, HRFADD2, HRFADD3, and HRFADD4 corresponding to the memory banks 531, 532, 533, and 534, respectively. The counter refresh signal CREF, the hammer refresh signal HREF, and the counter refresh address signal CRFADD may be provided commonly to the memory banks 531, 532, 533, and 534, e.g., to corresponding row select circuits 541, 542, 543, and 544. In some example embodiments, as will be described below with reference to FIG. 21, the hammer refresh address signals HRFADD1, HRFADD2, HRFADD3, and HRFADD4 provided to the memory banks 531, 532, 533 and 534 may be identical. In some other example embodiments, as will be described below with reference to FIG. 22, the hammer refresh address signals HRFADD1, HRFADD2, HRFADD3, and HRFADD4 provided to the memory banks 531, 532, 533, and 534 may be determined independently.

Figure 21:
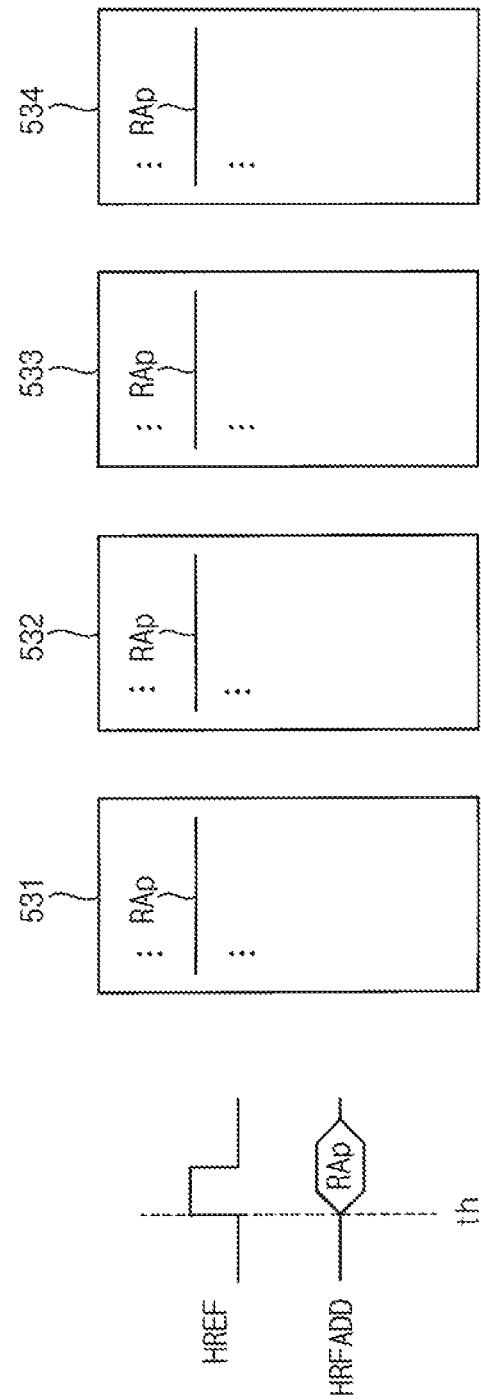
FIGS. 21 and 22 are diagrams for describing a hammer refresh operation of a memory device according to example embodiments.
Figure 22:
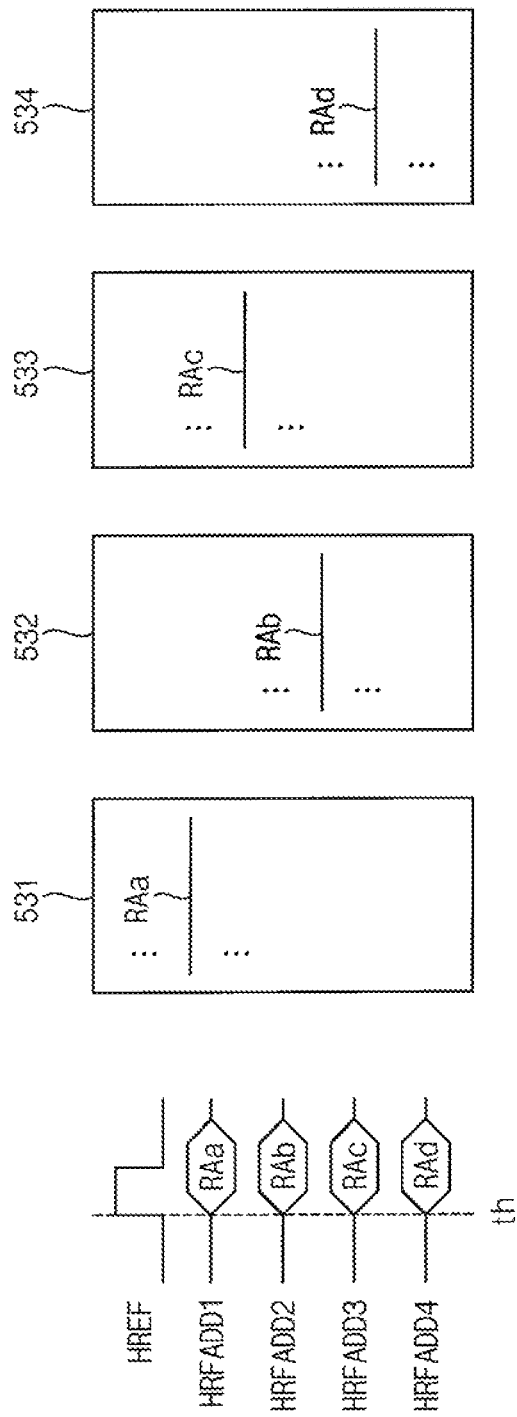

FIGS. 21 and 22 are diagrams for describing a hammer refresh operation of a memory device according to example embodiments.

Referring to FIGS. 20 and 21, the hammer refresh address signal HRFADD representing a refresh address RAp may be provided commonly to the memory banks 531, 532, 533, and 534 at an activation time point th of the hammer refresh signal HREF. Thus, the memory cells included in rows having addresses corresponding to the hammer refresh address signal HRFADD may be refreshed simultaneously in all of the memory banks 531, 532, 533, and 534.

Referring to FIGS. 20 and 22, the hammer refresh address signals HRFADD1, HRFADD2, HRFADD3, and HRFADD4 representing the refresh addresses RAa, RAb, RAc, and RAd, respectively, may be provided to the memory banks 531, 532, 533, and 534, respectively, at the activation time point th of the hammer refresh signal HREF. Thus, the memory cells included in rows having different refresh addresses RAa, RAb, RAc, and RAd in the respective memory banks 531, 532, 533, and 534 corresponding to the respective hammer refresh address signals HRFADD1, HRFADD2, HRFADD3, and HRFADD4 may be refreshed simultaneously.

Figure 23:
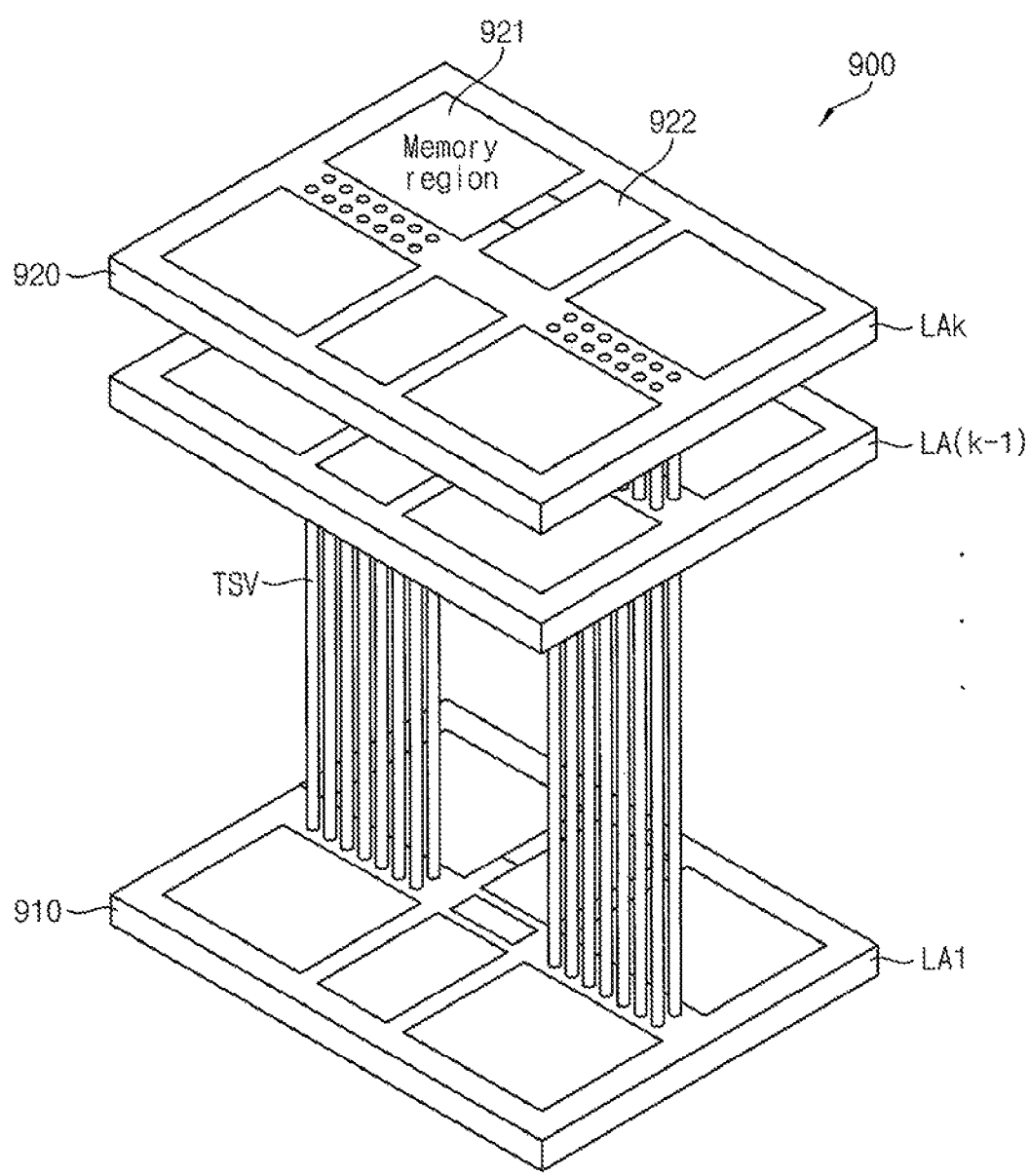
FIGS. 23 and 24 are diagrams illustrating a stacked memory device according to example embodiments.
Figure 24:
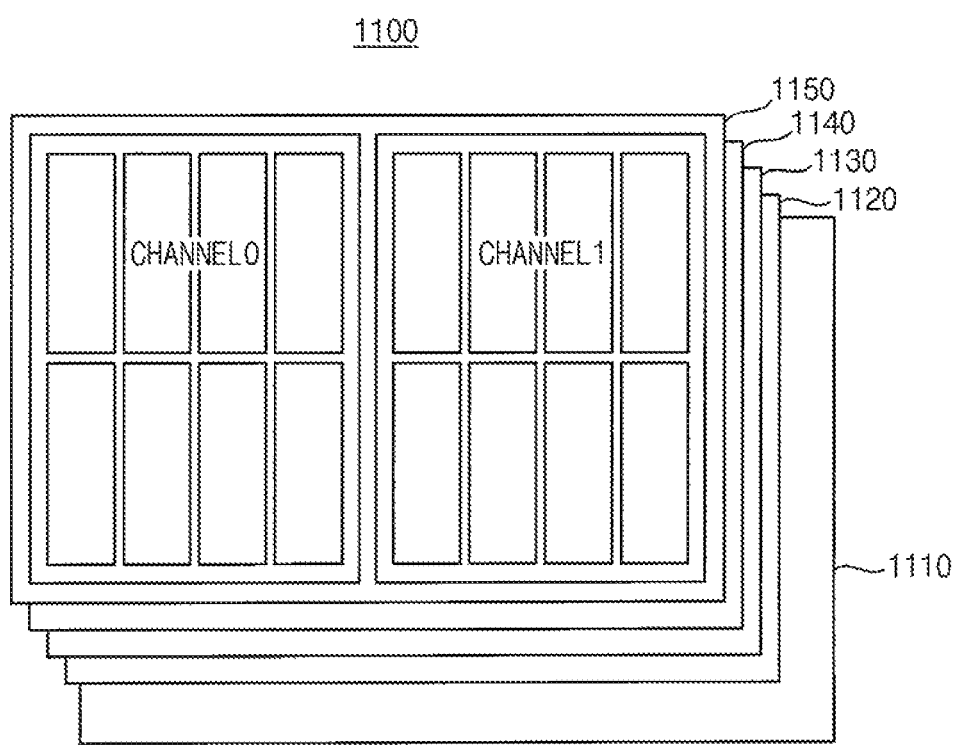

FIGS. 23 and 24 are diagrams illustrating a stacked memory device according to example embodiments.

Referring to FIG. 23, a semiconductor memory device 900 may include first through kth semiconductor integrated circuit layers LA1 (9100 through LAk (920), in which the lowest, first semiconductor integrated circuit layer LA1 is assumed to be an interface or control chip, and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1, as the interface or control chip, may communicate with an external memory controller through a conductive structure formed on an external surface.

Each of the first semiconductor integrated circuit layer LA1 910 through the kth semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 910 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layers may include a refresh control circuit as described above. The refresh control circuit may selectively perform the fixed hammer control mode FHCM or the variable hammer control mode VHCM as described above.

FIG. 24 illustrates an example high bandwidth memory (HBM) organization. Referring to FIG. 24, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 24 shows an example stack containing 4 DRAM semiconductor dies 1120, 1130, 1140, and 1150, and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

Each of the DRAM semiconductor dies 1120, 1130, 1140, and 1150 may include a refresh control circuit as described above. The refresh control circuit may selectively perform the fixed hammer control mode FHCM or the variable hammer control mode VHCM as described above.

Figure 25:
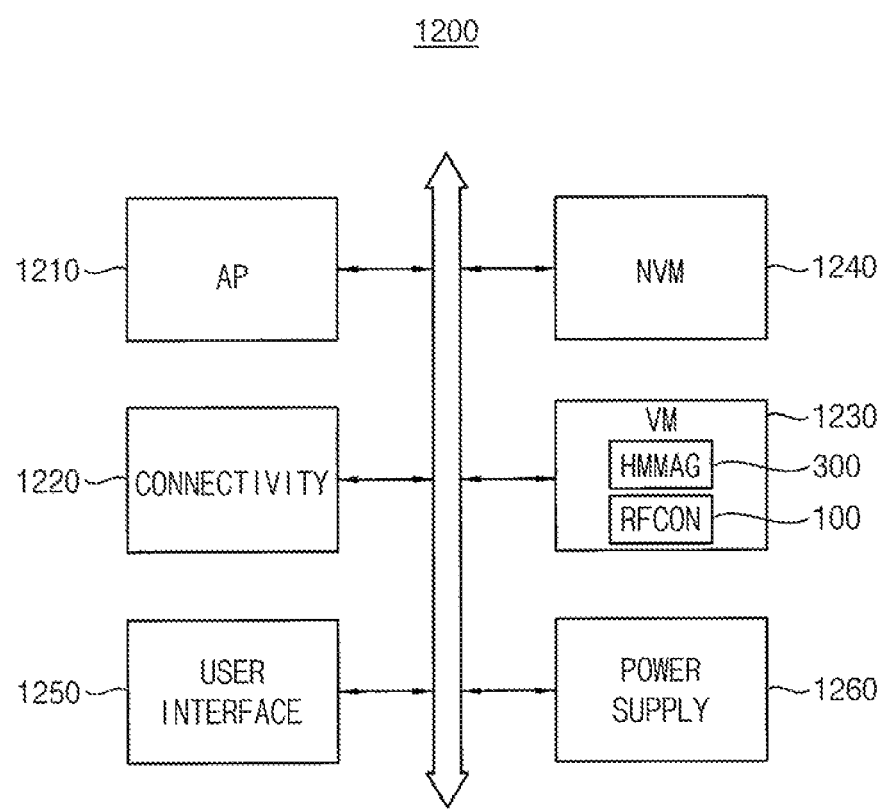
FIG. 25 is a block diagram illustrating a mobile system according to example embodiments.

FIG. 25 is a block diagram illustrating a mobile system according to example embodiments.

Referring to FIG. 25, a mobile system 1200 may include an application processor (AP) 1210, a connectivity unit 1220, a volatile memory device (VM) 1230, a nonvolatile memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc., The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As described above, a memory device according to an example embodiment may include a refresh controller RFCON 100 and a hammer address manager HMMAG 300. The hammer address manager 300 may manage access addresses synthetically with respect to the plurality of memory banks, and provide a hammer address for a hammer refresh operation among the access addresses, where the hammer address is an address that is accessed intensively. The refresh controller 100 may generate a hammer refresh address signal based on the hammer address, where the hammer refresh address signal represents a row that is physically adjacent to a row corresponding to the hammer address. According to example embodiments, the refresh control circuit may selectively perform the fixed hammer control mode FHCM or the variable hammer control mode VHCM as described above.

In some example embodiments, the hammer address manager 300 may be included in the memory controller of the application processor 1210, and the refresh controller 100 may be included in the volatile memory device 1230.

As described above, a memory system and a method of controlling refresh of a memory device according to example embodiments may efficiently prevent data loss due to hammer attack, and may enhance operation reliability of the memory device and the memory system by varying a hammer ratio (indicating a ratio of a unit hammer execution number with respect to a unit normal execution number) based on temperature information.

Embodiments described herein may be applied to any memory device employing a refresh operation and systems including the memory device. For example, embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

As described above, example embodiments may provide a memory device and a memory system capable of efficiently performing a hammer refresh operation. Example embodiments may provide a method of controlling refresh of a memory device capable of efficiently performing a hammer refresh operation.

A memory system and a method of controlling refresh of a memory device according to example embodiments may efficiently prevent data loss due to a hammer attack, and enhance operation reliability of the memory device and a memory system by varying a hammer ratio (indicating a ratio of a unit hammer execution number with respect to a unit normal execution number) based on temperature information.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system, comprising:
 a memory controller configured to generate refresh commands periodically by an average refresh interval; and
 a memory device configured to perform a normal refresh operation and a hammer refresh operation during a refresh cycle time from a time point when each refresh command is received, generation of other commands being inhibited during the refresh cycle time, the normal refresh operation being performed by sequentially selecting one-by-one a plurality of wordlines during a refresh period, the hammer refresh operation being performed by selecting a victim wordline physically adjacent to a hammer wordline that is accessed more frequently than other wordlines, wherein the memory device includes:
 a memory cell array including memory cells connected to the plurality of wordlines;
 a temperature sensor configured to provide temperature information by measuring an operation temperature of the memory cell array; and
 a refresh controller configured to control the normal refresh operation and the hammer refresh operation, and configured to vary a hammer ratio of a unit hammer execution number of the hammer refresh operation executed during the refresh cycle time with respect to a unit normal execution number of the normal refresh operation executed during the refresh cycle time.

2. The memory system as claimed in claim 1, wherein:
 the memory controller is configured to set a first temperature level and a second temperature level, the operation temperature of the memory cell array being higher in the first temperature level than in the second temperature level, and
 the memory controller is configured to maintain the average refresh interval regardless of the first temperature level and the second temperature level in a variable hammer control mode.

3. The memory system as claimed in claim 2, wherein the refresh controller is configured to vary the hammer ratio based on the temperature information provided from the temperature sensor in the variable hammer control mode.

4. The memory system as claimed in claim 2, wherein:
 the memory controller is configured to transfer hammer control information using a mode register set write command based on the temperature information provided from the memory device, the memory device is configured to store the hammer control information in a mode register, and the refresh controller is configured to vary the hammer ratio in the variable hammer control mode based on the hammer control information stored in the mode register.

5. The memory system as claimed in claim 2, wherein the refresh controller is configured to vary the hammer ratio in the variable hammer control mode such that the hammer ratio corresponding to the second temperature level is higher than the hammer ratio corresponding to the first temperature level.

6. The memory system as claimed in claim 2, wherein:
the refresh controller is configured to vary the unit normal execution number in the variable hammer control mode such that the unit normal execution number corresponding to the second temperature level is smaller than the unit normal execution number corresponding to the first temperature level, and the refresh controller is configured to maintain the unit hammer execution number, regardless of the first temperature level and the second temperature level, in the variable hammer control mode.

7. The memory system as claimed in claim 6, wherein the refresh controller is configured to vary an operation interval, which indicates a time interval between two adjacent refresh operations, such that the operation interval corresponding to the second temperature level is longer that the operation interval corresponding to the first temperature level.

8. The memory system as claimed in claim 7, wherein the memory controller is configured to maintain the refresh cycle time, regardless of the first temperature level and the second temperature level, in the variable hammer control mode.

9. The memory system as claimed in claim 6, wherein the refresh controller is configured to maintain an operation interval, regardless of the first temperature level and the second temperature level, in the variable hammer control mode, the operation interval indicating a time interval between two adjacent refresh operations.

10. The memory system as claimed in claim 9, wherein the memory controller is configured to vary the refresh cycle time in the variable hammer control mode such that the refresh cycle time corresponding to the second temperature level is shorter than the refresh cycle time corresponding to the first temperature level.

11. The memory system as claimed in claim 2, wherein:
the refresh controller is configured to vary the unit normal execution number in the variable hammer control mode such that the unit normal execution number corresponding to the second temperature level is smaller than the unit normal execution number corresponding to the first temperature level, and the refresh controller is configured to vary the unit hammer execution number in the variable hammer control mode such that the unit hammer execution number corresponding to the second temperature level is greater than the unit hammer execution number corresponding to the first temperature level.

12. The memory system as claimed in claim 2, wherein the refresh controller is configured to compare a target hammer execution number of the hammer refresh operation to be executed during the refresh cycle time with an available hammer execution number of the hammer refresh operation executable during the refresh cycle time, determine the available hammer execution number as the unit hammer execution number when the target hammer execution number is greater than the available hammer execution number, and determine the target hammer execution number as the unit hammer execution number when the target hammer execution number is smaller than the available hammer execution number.

13. The memory system as claimed in claim 2, wherein the memory controller is configured to vary the average refresh interval in a fixed hammer control mode such that the average refresh interval corresponding to the second temperature level is longer than the average refresh interval corresponding to the first temperature level.

14. The memory system as claimed in claim 13, wherein the refresh controller is configured to maintain the unit normal execution number and the unit hammer execution number, regardless of the first temperature level and the second temperature level, in the fixed hammer control mode.

15. The memory system as claimed in claim 13, wherein:
the memory controller is configured to transfer hammer control information indicating the variable hammer control mode or the fixed hammer control mode using a mode register set write command, the memory device is configured to store the hammer control information in a mode register, and the refresh controller is configured to vary the hammer ratio in the variable hammer control mode based on the hammer control information stored in the mode register.

16. A method of controlling refresh of a memory device, the method comprising:
providing temperature information by measuring an operation temperature of a memory cell array included in the memory device;

receiving refresh commands periodically by an average refresh interval from a memory controller;

performing a normal refresh operation by sequentially selecting one-by-one a plurality of wordlines during a refresh period;

performing a hammer refresh operation by selecting a victim wordline physically adjacent to a hammer wordline that is accessed more frequently than other wordlines; and based on the temperature information, varying a hammer ratio of a unit hammer execution number of the hammer refresh operation executed during a refresh cycle time with respect to a unit normal execution number of the normal refresh operation executed during the refresh cycle time.

17. The method as claimed in claim 16, further comprising:
maintaining the average refresh interval regardless of a first temperature level and a second temperature level in a variable hammer control mode, where the operation temperature of the memory cell array is higher in the first temperature level than in the second temperature level; and varying the average refresh interval such that the average refresh interval corresponding to the second temperature level is shorter than the average refresh interval corresponding to the first temperature level in a fixed hammer control mode.

18. The method as claimed in claim 17, wherein varying the hammer ratio includes:
varying the hammer ratio such that the hammer ratio corresponding to the second temperature level is higher than the hammer ratio corresponding to the first temperature level in the variable hammer control mode.

19. The method as claimed in claim 17, wherein varying the hammer ratio includes:

maintaining the unit normal execution number and the unit hammer execution number regardless of the first temperature level and the second temperature level in the fixed hammer control mode.

20. A memory device, comprising:

a memory cell array including memory cells connected to a plurality of wordlines;

a temperature sensor configured to provide temperature information by measuring an operation temperature of the memory cell array; and a refresh controller configured to control a normal refresh operation and a hammer refresh operation, the normal refresh operation being performed by sequentially selecting one-by-one the plurality of wordlines during a refresh period, the hammer refresh operation being performed by selecting a victim wordline physically adjacent to a hammer wordline that is accessed more frequently than other wordlines, and the refresh controller being configured to, based on the temperature information, vary a hammer ratio of a unit hammer execution number of the hammer refresh operation executed during a refresh cycle time with respect to a unit normal execution number of the normal refresh operation executed during the refresh cycle time.

* * * * *